United States Patent [19]
Fujisaki et al.

[11] Patent Number: 5,763,950
[45] Date of Patent: Jun. 9, 1998

[54] SEMICONDUCTOR ELEMENT COOLING APPARATUS

[75] Inventors: Akihiko Fujisaki; Junichi Ishimine; Masumi Suzuki; Masahiro Miyo; Shunichi Kikuchi; Minoru Hirano; Hitoshi Nori, all of Kawasaki, Japan

[73] Assignee: Fujitsu Limited, Kawasaki, Japan

[21] Appl. No.: 598,331

[22] Filed: Feb. 8, 1996

Related U.S. Application Data

[63] Continuation of Ser. No. 243,992, May 18, 1994, abandoned.

[30] Foreign Application Priority Data

Jul. 30, 1993 [JP] Japan .................. 5-190603

[51] Int. Cl.⁶ ............................................. H01L 23/34
[52] U.S. Cl. .................. 257/712; 257/721; 257/722; 361/697; 361/709; 361/719; 165/80.3
[58] Field of Search .................. 257/712, 721, 257/722; 165/80.3; 361/697, 709, 717, 718, 719

[56] References Cited

U.S. PATENT DOCUMENTS

| | | | |
|---|---|---|---|
| 4,296,455 | 10/1981 | Leycraft et al. | 257/721 |
| 4,459,638 | 7/1984 | Brehm et al. | 257/722 |
| 4,541,004 | 9/1985 | Moore | 357/81 |
| 4,699,208 | 10/1987 | Wolf et al. | 165/47 |
| 5,077,601 | 12/1991 | Hatada et al. | 357/81 |
| 5,241,452 | 8/1993 | Kitajo | 257/722 |
| 5,304,845 | 4/1994 | Lindquist et al. | 257/722 |
| 5,311,928 | 5/1994 | Marton | 257/722 |
| 5,335,722 | 8/1994 | Wu | 257/722 |

FOREIGN PATENT DOCUMENTS

| | | | |
|---|---|---|---|
| 0 219 657 | 4/1987 | European Pat. Off. . | |
| 0 458 500 | 11/1991 | European Pat. Off. . | |
| 0 485 281 A1 | 11/1991 | European Pat. Off. . | |
| 2531450 | 1/1977 | Germany | 257/722 |
| 0087844 | 5/1984 | Japan | 257/722 |
| 0133338 | 5/1989 | Japan | 257/721 |
| 0012559 | 1/1992 | Japan | 257/722 |
| 1341294 | 4/1971 | United Kingdom . | |
| 2174193 | 10/1986 | United Kingdom . | |
| WO 93/06340 | 4/1993 | WIPO . | |

OTHER PUBLICATIONS

IBM Technical Bulletin, vol. 32, No. 11, Apr. 1990, pp. 64–65.

Patents Abstracts of Japan, vol. 12, No. 44 (E–581) Feb. 9, 1998 of JP62–195157 (Hitachi VLSI Eng. Corp.) Aug. 27, 1987.

Patents Abstracts of Japan, vol. 17, No. 440 (E–1414) Aug. 13, 1993 of JP5–95062 (Fujitsu Ltd.) Apr. 16, 1993.

*Primary Examiner*—Tom Thomas
*Assistant Examiner*—David Ostrowski
*Attorney, Agent, or Firm*—Armstrong, Westerman, Hattori, McLeland & Naughton

[57] ABSTRACT

A semiconductor element cooling apparatus adapted to cool at least one semiconductor element mounted on a circuit substrate. The semiconductor element cooling apparatus includes a first mechanism for generating a coolant flow by flowing a coolant over a top surface of the semiconductor element, and a second mechanism for obliquely obstructing the coolant flowing over the semiconductor element from an upstream side towards a downstream side of the coolant flow.

8 Claims, 22 Drawing Sheets

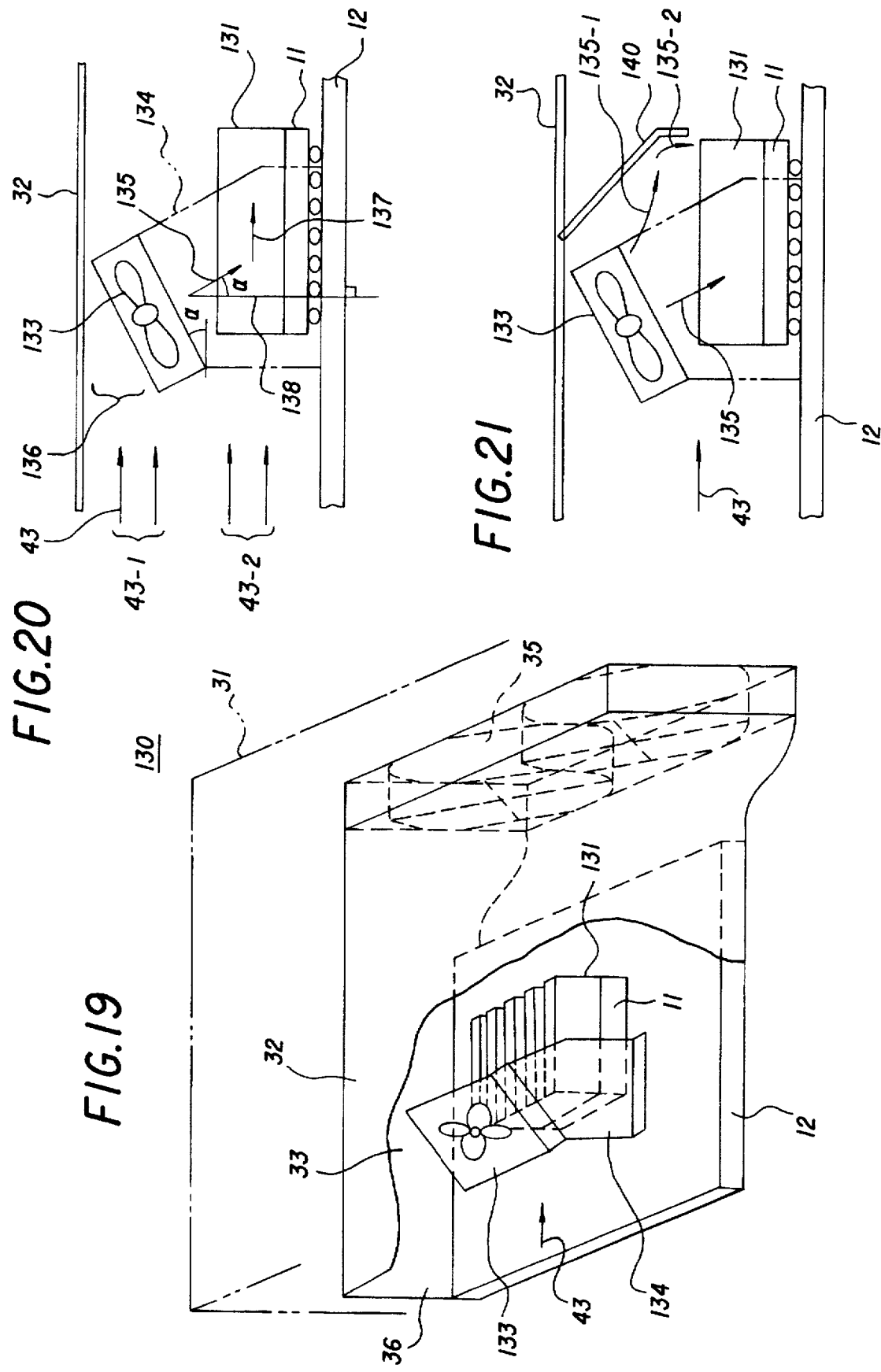

$b3 < b2 < b1$ $b12 < b11$ b22 <b21
b22 <b23

SEMICONDUCTOR ELEMENT COOLING APPARATUS

This application is a continuation of application Ser. No. 08/243,992 filed May 18, 1994, now abandoned.

BACKGROUND OF THE INVENTION

The present invention generally relates to semiconductor element cooling apparatuses, and more particularly to a semiconductor cooling apparatus for cooling semiconductor elements which are mounted on a circuit substrate and assembled within a piece of electronic equipment.

Recently, the heat generated by the semiconductor element has increased due to the improved integration density and the high-speed operation of the integrated circuit. This tendency is particularly notable in the field of large scale integrated circuits (LSIs) which are used in computers and the like. For example, on the chip level, it is not rare that heat on the order of 10 W is generated per 1 $cm^2$, and it is expected that this value will be doubled or tripled in the near future.

On the other hand, the mounting density of the semiconductor elements within the electronic equipment is also rapidly increasing. Consequently, it is becoming more difficult to carry out cooling within the piece of electronic equipment.

Furthermore, in order to stably operate the semiconductor elements, it is essential to maintain the temperature of the semiconductor elements low, and a high cooling efficiency is required of the cooling apparatus.

FIG. 1 shows a conventional semiconductor element cooling apparatus 10. In FIG. 1, semiconductor elements 11 are mounted on a circuit substrate 12 via a plurality of connecting members 13 such as solder. A plurality of pin-shaped fins 14 are fixed on a top surface 11a of the semiconductor element 11, perpendicularly to the top surface 11a.

The semiconductor element 11 is cooled when a coolant (cooling medium) 15 flows parallel to the circuit substrate 12 and passes the periphery of the semiconductor element 11. In other words, the cooling takes place due to heat exchange between the coolant 15 and the pin-shaped fins 14 and the top surface 11a of the semiconductor element 11.

On the other hand, FIG. 2 shows another conventional semiconductor element cooling apparatus 20. In FIG. 2, the semiconductor element 11 is mounted on the circuit substrate 12, and a nozzle 21 is arranged above the semiconductor element 11, perpendicularly to the top surface 11a of the semiconductor element 11.

A high-speed coolant flow 22 ejected from the nozzle 21 at a high speed hits the top surface 11a of the semiconductor element 11, and thereafter forms a jet flow 23 which spreads radially along the top surface 11a, so as to cool the semiconductor element 11. Such a cooling using the jet flow is advantageous in that a relatively high cooling efficiency can be obtained by employing a relatively simple construction.

According to the semiconductor element cooling apparatus 10 shown in FIG. 1, it is necessary to increase the length of the pin-shaped fins 14 or to increase the number of the pin-shaped fins 14 per unit area on the top surface 11a of the semiconductor element 11. However, the former method of increasing the length of the pin-shaped fins 14 deteriorates the fin efficiency, and there is a limit to improving the cooling efficiency. On the other hand, the latter method of increasing the number of the pin-shaped fins 14 per unit area increases the flow resistance, and the cooling efficiency is not as high as expected because the flow of the coolant is blocked at the lower parts of the pin-shaped fins 14 and at the top surface 11a of the semiconductor element 11.

On the other hand, according to the semiconductor element cooling apparatus 20 shown in FIG. 2, a space having a height A is inevitably required above the circuit substrate 12 because of the need to arrange the nozzle 21 so as to confront the top surface 11a of the semiconductor element 11. As a result, it is difficult to accommodate the circuit substrate 12 within the electronic equipment with a high density by arranging the circuit substrate 12 at a narrow pitch.

SUMMARY OF THE INVENTION

Accordingly, it is a general object of the present invention to provide a novel and useful semiconductor element cooling apparatus in which the problems described above are eliminated.

Another and more specific object of the present invention is to provide a semiconductor element cooling apparatus adapted to cool at least one semiconductor element mounted on a circuit substrate, comprising a first means for generating a coolant flow by flowing a coolant over a top surface of the semiconductor element, and a second means for obliquely obstructing the coolant flowing over the semiconductor element from an upstream side towards a downstream side of the coolant flow. According to the semiconductor element cooling apparatus of the present invention, the coolant flow efficiently absorbs the heat from the top surface of the semiconductor element, and the cooling efficiency is improved.

Still another object of the present invention is to provide the semiconductor element cooling apparatus described above, wherein the second means comprises a plurality of inclined pillar-shaped radiator fins provided on the top surface of the semiconductor element and respectively having a portion which is inclined to the upstream side of the coolant flow. According to the semiconductor element cooling apparatus of the present invention, the cooling efficiency is improved at the lower part of the inclined pillar-shaped radiator fins towards the top surface of the semiconductor element, and the surface area of the inclined pillar-shaped radiator fins is increased. For this reason, it is possible to improve the cooling efficiency of the semiconductor element.

A further object of the present invention is to provide the semiconductor element cooling apparatus described above, wherein the second means further comprises a comb shaped structure connecting top ends of the inclined pillar-shaped radiator fins which are arranged in a direction generally perpendicular to a direction of the coolant flow. According to the semiconductor element cooling apparatus of the present invention, it is possible to manufacture the plurality of inclined pillar-shaped radiator fins in one process, and the productivity is greatly improved.

Another object of the present invention is to provide the semiconductor element cooling apparatus described above, wherein the first means comprises a passage forming member forming a passage between the passage forming member and the top surface of the semiconductor element, and a coolant driving unit for supplying the coolant to the passage so as to form a parallel coolant flow within the passage, the parallel coolant flow being approximately parallel to the top surface of the semiconductor element, and the second means comprises a fan which is provided at a position confronting the semiconductor element and is inclined with respect to the top surface of the semiconductor element. According to the semiconductor element cooling apparatus of the present invention, the fan generates a jet flow of the coolant having a large flow quantity. For this reason, it is possible to increase the flow quantity of the coolant obliquely the top surface of the semiconductor element, and accordingly cool the semiconductor element with a high cooling efficiency.

Still another object of the present invention is to provide the semiconductor element cooling apparatus described above, which further comprises third means, provided on a periphery of the fan, for restricting the coolant ejected from the fan from moving around to a draw-in side of the fan. According to the semiconductor element cooling apparatus of the present invention, it is possible to prevent the coolant ejected from the fan from moving around to the draw-in side of the fan, and thus prevent the temperature of the coolant from rising thereby. In other words, the coolant ejected from the fan can always be maintained to a low temperature, and it is therefore possible to stably cool the semiconductor element.

A further object of the present invention is to provide the semiconductor element cooling apparatus described above, wherein the first means comprises a passage forming member forming a passage between the passage forming member and the top surface of the semiconductor element, and a coolant driving unit for supplying the coolant to the passage so as to form a parallel coolant flow within the passage, the parallel coolant flow being approximately parallel to the top surface of the semiconductor element, and the second means comprises a duct having a tip end which confronts the semiconductor element and is inclined with respect to the top surface of the semiconductor element, and a fan ejecting the coolant from the duct. According to the semiconductor element cooling apparatus of the present invention, it is possible to form a jet flow of the coolant having a large flow quantity. For this reason, the flow quantity of the coolant directed at the top surface of the semiconductor element can be increased, thereby enabling the semiconductor element to be cooled with a high cooling efficiency.

Another object of the present invention is to provide a semiconductor element cooling apparatus adapted to cool at least one semiconductor element mounted on a circuit substrate, comprising a passage forming member forming a passage between the passage forming member and a top surface of the semiconductor element, a coolant driving unit supplying a coolant to the passage so as to form a parallel coolant flow above the top surface of the semiconductor element, where the parallel coolant flow is approximately parallel to the top surface of the semiconductor element, and one or a plurality of partition members provided on a surface of the passage forming member confronting the top surface of the semiconductor element, where each of the partition members have a base part which extends in a direction generally perpendicular to the parallel coolant flow, and a tip part which forms a slit-shaped coolant outlet having a predetermined gap between the tip part and the top surface of the semiconductor element. According to the semiconductor element cooling apparatus of the present invention, it is unnecessary to use a nozzle as in the conceivable case. It is possible to utilize the high cooling efficiency of the jet flow of the coolant, and at the same time, enable the circuit substrates and thus the semiconductor elements to be mounted within the piece of electronic equipment with a high mounting density.

Still another object of the present invention is to provide the semiconductor element cooling apparatus described above, which further comprises one or a plurality of surfaces provided on the top surface of the semiconductor element, where the coolant ejected from the slit-shaped coolant outlet hits the one or plurality of surfaces. According to the semiconductor element cooling apparatus of the present invention, it is possible to rapidly change the direction of the coolant flow by collision, and thus improve the cooling efficiency of the semiconductor element.

A further object of the present invention is to provide the semiconductor element cooling apparatus described above, wherein the one or plurality of partition members structurally connect to the semiconductor element directly without via the circuit substrate. According to the semiconductor element cooling apparatus of the present invention, the partition member and the passage forming member can be connected to the semiconductor element without via the circuit substrate. As a result, the assembling process is facilitated, and the cooling performance is stabilized.

Other objects and further features of the present invention will be apparent from the following detailed description when read in conjunction with the accompanying drawings.

BRIEF DESCRIPTION OF THE DRAWINGS

FIG. 19 is a perspective view, with a part cut away, showing a second embodiment of the semiconductor element cooling apparatus according to the present invention;

FIG. 20 is a side view for explaining the relationship of a fan and a semiconductor element in FIG. 19;

FIG. 21 is a side view showing a first modification of the second embodiment;

DESCRIPTION OF THE PREFERRED EMBODIMENTS

Figure 1:
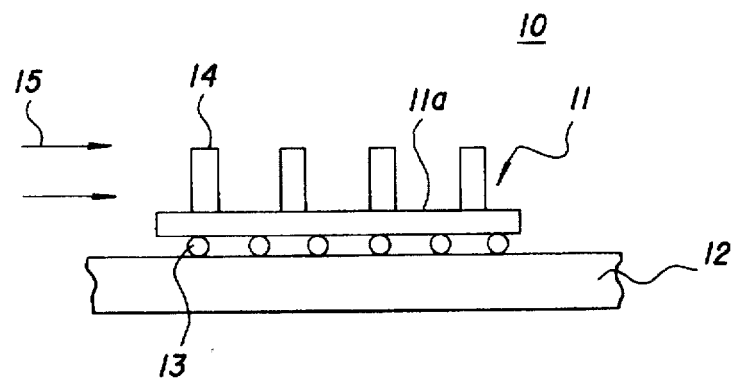
FIG. 1 is a side view showing a conventional semiconductor element cooling apparatus.
Figure 2:
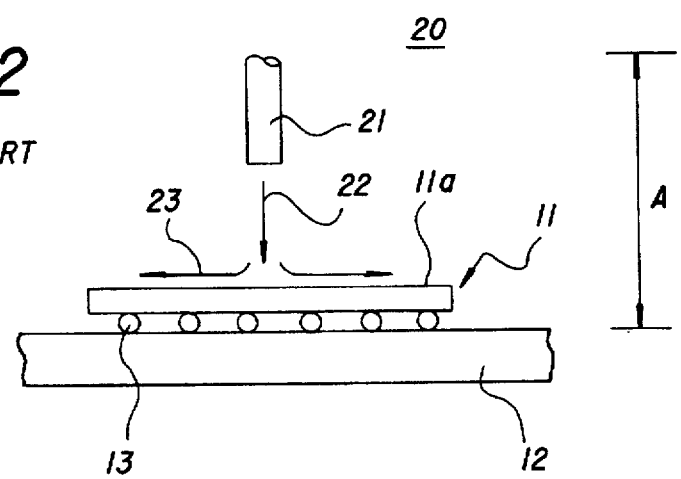
FIG. 2 is a side view showing another conventional semiconductor element cooling apparatus.
Figure 3:
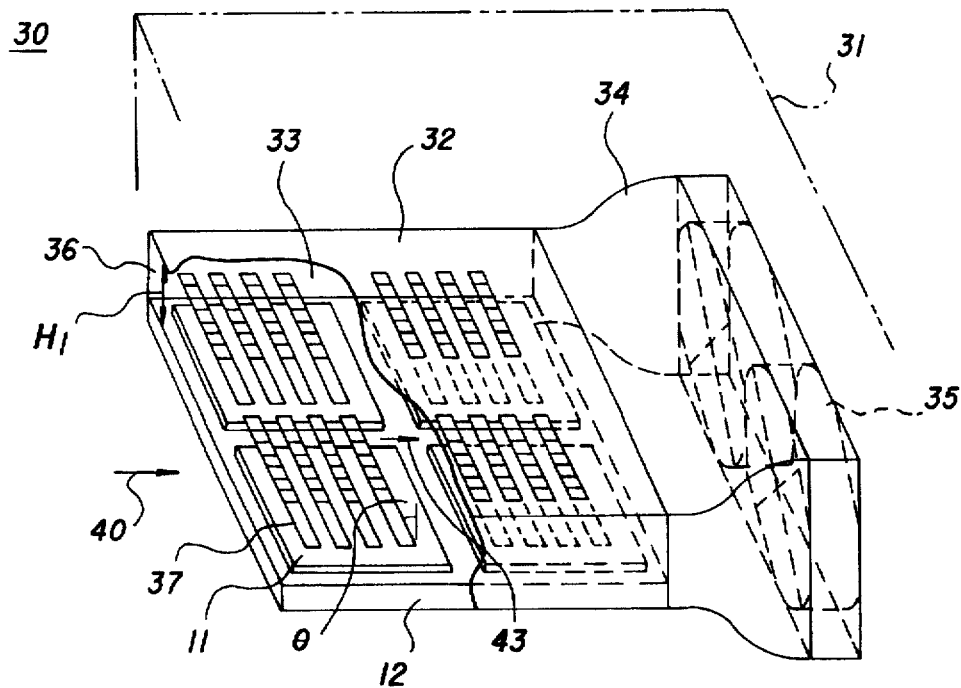
FIG. 3 is a perspective view, with a part cut away, showing a first embodiment of a semiconductor element cooling apparatus according to the present invention.

FIG. 3 shows a first embodiment of a semiconductor element cooling apparatus according to the present invention. In a semiconductor element cooling apparatus 30 shown in FIG. 3, a circuit substrate 12 and a passage forming member 32 are accommodated within a housing 31 of an electronic equipment. A plurality of semiconductor elements 11 are mounted on the circuit substrate 12. The passage forming member 32 is arranged parallel to the circuit substrate 12, and covers a top surface of the circuit substrate 12 on which the semiconductor elements 11 are mounted. The passage forming member 32 confronts the top surface of the circuit substrate 12 with a gap formed therebetween. A passage 33 having a height $H_1$ is formed between the circuit substrate 12 and the passage forming member 32. A fan 35 is coupled to one end of the passage 33 via a duct 34, as a coolant driving unit for ejecting a coolant (cooling medium). On the other hand, a coolant inlet 36 is provided on the other end of the passage 33.

When the fan 35 is driven, air 40 is drawn in from the coolant inlet 36 as the coolant. Hence, a parallel coolant flow 43 which is parallel to the circuit substrate 12 occurs within the passage 33 as indicated by an arrow.

Figure 4:
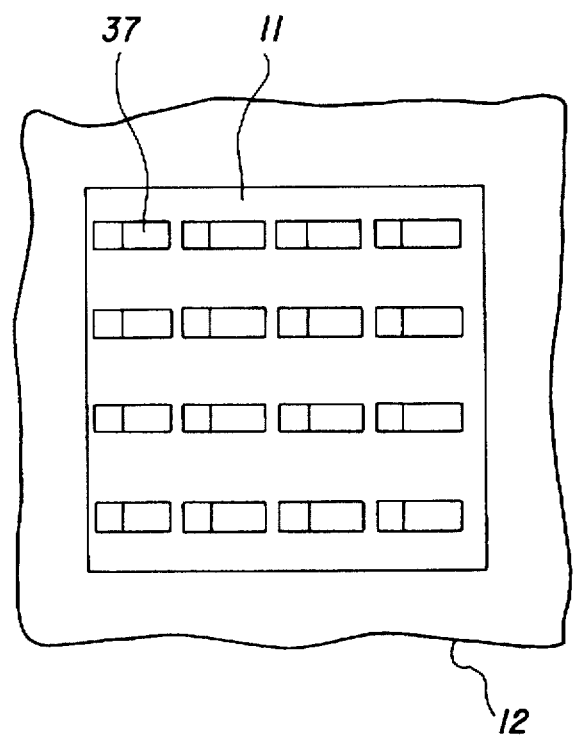
FIG. 4 is a plan view showing a semiconductor element shown in FIG. 3.
Figure 5:
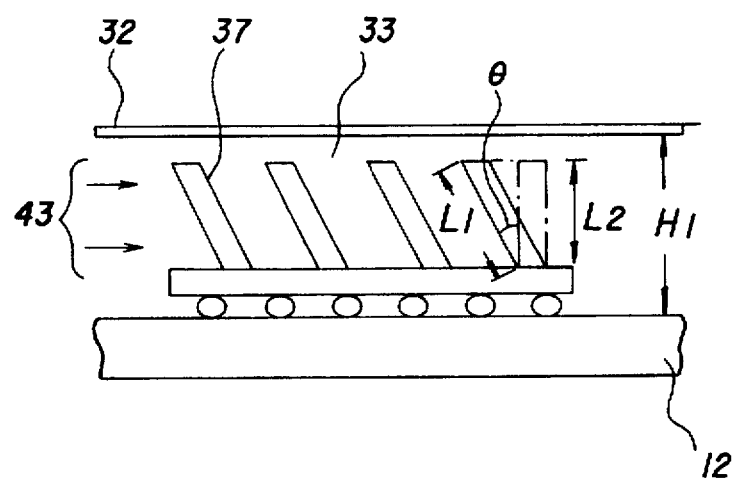
FIG. 5 is a side view showing a part of the semiconductor element shown in FIG. 3.

As shown in FIGS. 4 and 5, a plurality of inclined pillar-shaped or columnar radiator fins 37 are provided on a top surface 11a of the semiconductor element 11 in a matrix arrangement. The inclined columnar radiator fins 37 are provided on the upstream side of the parallel coolant flow 43, that is, on the side of the coolant inlet 36. The inclined columnar radiator fins 37 are fixed with an inclination angle θ relative to a direction perpendicular to the top surface 11a of the semiconductor element 11. The inclined columnar radiator fins 37 themselves function as means for obliquely obstructing the air 40.

During operation of the electronic equipment, the semiconductor element 11 generates heat. Majority of the generated heat spreads towards the inclined columnar radiator fins 37 due to thermal conduction. On the other hand, the fan 35 is also driven. Hence, the generated parallel coolant flow 43 absorbs the heat from the inclined columnar radiator fins 37 and the top surface 11a of the semiconductor element 11 as the parallel coolant flow 43 passes the periphery of the semiconductor element 11. As a result, the semiconductor element 11 is cooled.

According to the semiconductor element cooling apparatus 30, the following effects are obtained because the inclined columnar radiator fins 37 are inclined towards the upstream side at the inclination angle θ, and the cooling efficiency with respect to the semiconductor element 11 is improved.

Figure 6:
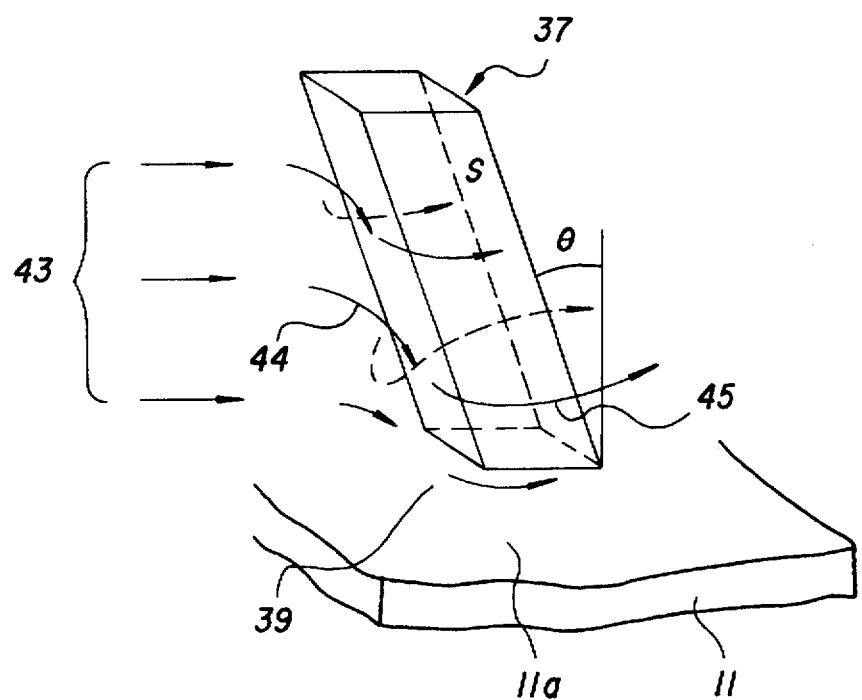
FIG. 6 is a perspective view for explaining the functions of an inclined columnar radiator fin.

1) Stimulated coolant flow from lower part of fins towards the top surface of the semiconductor element:

As shown in FIG. 6, the parallel coolant flow 43 in the periphery of the inclined columnar radiator fin 37 is formed into a downwardly inclined flow 44 along a front surface 38 of the inclined columnar radiator fin 37, and thereafter flows towards the downstream side by being divided into both sides of the inclined columnar radiator fin 37 as indicated by an arrow 45. For this reason, the rate of coolant flow from the lower part of the inclined columnar radiator fin 37 towards a fin base periphery 39 at the top surface 11a increases, and it is possible to efficiently carry out the cooling at this part.

2) Enlarged surface area of the columnar radiator fin:

As shown in FIG. 5, with respect to the same height $L_2$ of the columnar radiator fin, the length of the columnar radiator fin is $L_2$ when the columnar radiator fin is not inclined, but the length of the columnar radiator fin is $L_1$ when the columnar radiator fin is inclined by the inclination angle θ. $L_1$ is equal to $L_2/\cos θ$, and thus, the length $L_1$ becomes greater than the length $L_2$ as the inclination angle θ increases. Since the height of the columnar radiator fin is restricted by the height $H_1$ of the passage 33, it is possible to increase the length of the columnar radiator fin and also increase the surface area of the columnar radiator fin compared to those of the conceivable semiconductor element cooling apparatus by inclining the columnar radiator fin as in the case of the inclined columnar radiator fin 37. For this reason, the heat quantity transferred from the inclined columnar radiator fin 37 to the parallel coolant flow 43 is increased compared to that of the conceivable semiconductor element cooling apparatus.

In this embodiment, no particular limit is provided with respect to the inclination angle θ of the inclined columnar radiator fin 37. However, the above described effects cannot be obtained to a satisfactory extent if the inclination angle θ is too small. On the other hand, if the inclination angle θ is too large, the tip end of the inclined columnar radiator fin 37 greatly projects to the front and interferes with the mounting of the adjacent semiconductor element. Furthermore, the gap between the adjacent inclined columnar radiator fins 37 becomes small and interferes with the proper coolant flow. In other words, the superior cooling effect of the inclined columnar radiator fin 37 itself is lost if the inclination angle θ is too large. Accordingly, from the practical point of view, it is desirable that the inclination angle θ is in a range of 10° to 60°.

The cross sectional shape of the inclined columnar radiator fin 37 is not limited to the rectangular shape of this embodiment. Similar effects can be obtained by using inclined columnar radiator fins having other cross sectional shapes such as a circular shape.

In addition, the semiconductor element 11 to be cooled is not limited to the bear-chip type shown in FIG. 3. For example, the semiconductor element 11 may be provided within a package or take the form of a multi-chip module.

Furthermore, the coolant is not limited to air, and other gasses and liquids may be used instead. For example, a liquid such as carbon fluoride may be used as the coolant. In this case, a pump is used as the coolant driving unit in place of the fan. Moreover, a tank for supplying and recovering the coolant, piping and a heat exchanger for cooling the coolant may be provided if necessary. It is of course possible to circulate the coolant among the tank, the pump, the heat exchanger and the passage 33.

The surface of the passage forming member 32 confronting the circuit substrate 12 may be formed by the bottom surface of another circuit substrate which is accommodated in parallel to and adjacent to the circuit substrate 12. The bottom surface of this other circuit substrate is opposite to the surface on which the semiconductor elements are mounted. In addition, the surface of the passage forming member 32 intersecting the circuit substrate 12 may be formed by the surface of another substrate such as a mother board connecting to the circuit substrate 12, the surface of a part such as a connector provided on the circuit substrate 12 and facing upstream side of the parallel coolant flow 43 and the like.

Next, a description will be given of modifications of the inclined columnar radiator fin 37 of the first embodiment.

Figure 7:
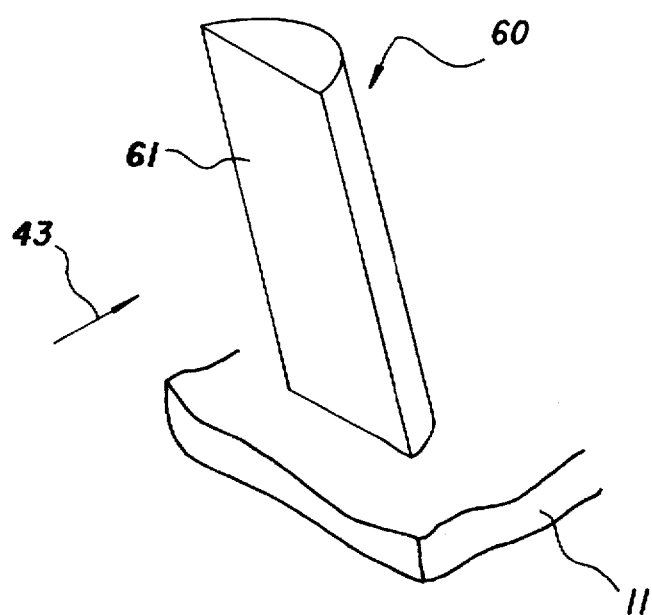
FIG. 7 is a perspective view showing a first modification of a radiator fin shown in FIG. 3.

FIG. 7 shows a first modification of the inclined columnar radiator fin. An inclined columnar radiator fin 60 show in FIG. 7 has an approximately semi-circular cross section. The inclined columnar radiator fin 60 is arranged so that a flat surface 61 thereof faces the upstream side of the parallel coolant flow 43.

According to the shape of this first modification of the inclined columnar radiator fin, the resistance with respect to the parallel coolant flow 43 in a vicinity of the front surface of the inclined columnar radiator fin 60 is large. For this reason, it is possible to generate a stronger downwardly inclined flow 44 than the first embodiment, thereby contributing to an improved cooling efficiency.

Figure 8:
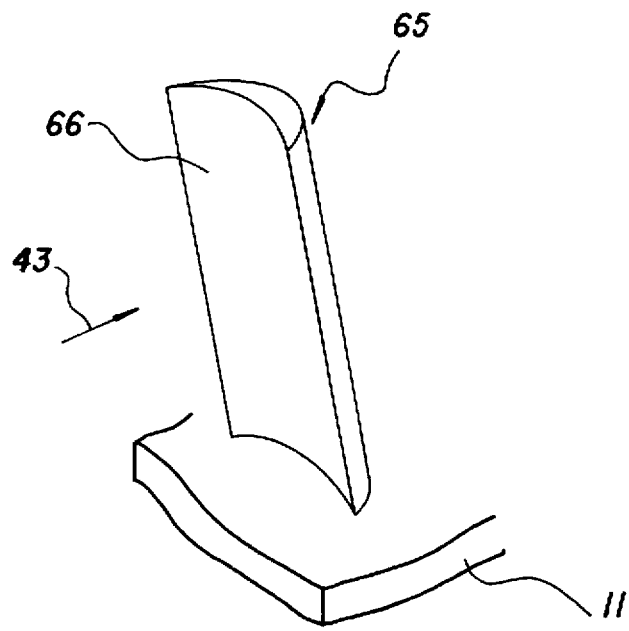
FIG. 8 is a perspective view showing a second modification of the radiator fin shown in FIG. 3.

FIG. 8 shows a second modification of the inclined columnar radiator fin. An inclined columnar radiator fin 65 shown in FIG. 8 has a crescent moon shaped cross section. The inclined columnar radiator fin 65 is arranged so that a concave surface 66 thereof faces the upstream side of the parallel coolant flow 43.

According to the shape of this second modification of the inclined columnar radiator fin, it is possible to generate a stronger downwardly inclined flow 44 similarly to the first modification, thereby contributing to the improved cooling efficiency.

Figure 9:
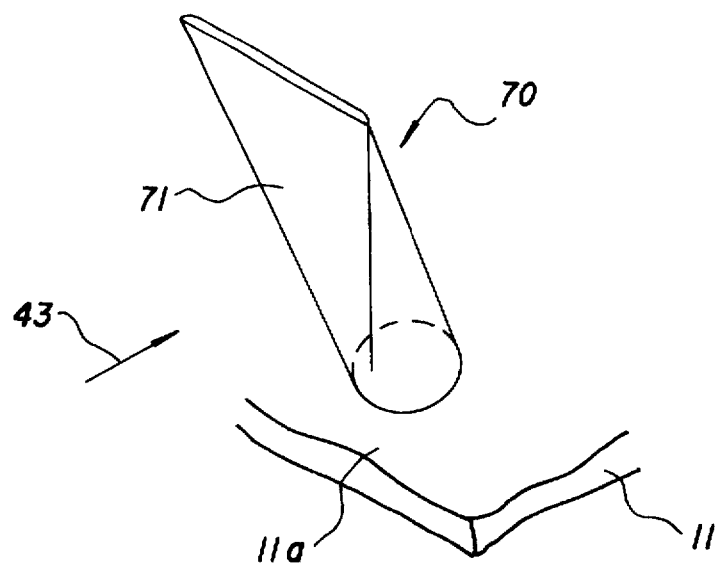
FIG. 9 is a perspective view showing a third modification of the radiator fin shown in FIG. 3.

FIG. 9 shows a third modification of the inclined columnar radiator fin. An inclined columnar radiator fin 70 shown in FIG. 9 has a flattened cylindrical shape such that a cylinder is flattened more towards the tip end. The inclined columnar radiator fin 70 is arranged so that an approximately inverted triangular surface 71 faces the upstream side of the parallel coolant flow 43.

According to the shape of this third modification of the inclined columnar radiator fin, the flow resistance at the lower part of the inclined columnar radiator fin 70 relatively decreases with respect to that at the upper part of the inclined columnar radiator fin 70. As a result, the coolant flow in the vicinity of the top surface 11a of the semiconductor element 11 is stimulated, thereby improving the cooling efficiency.

Figure 10:
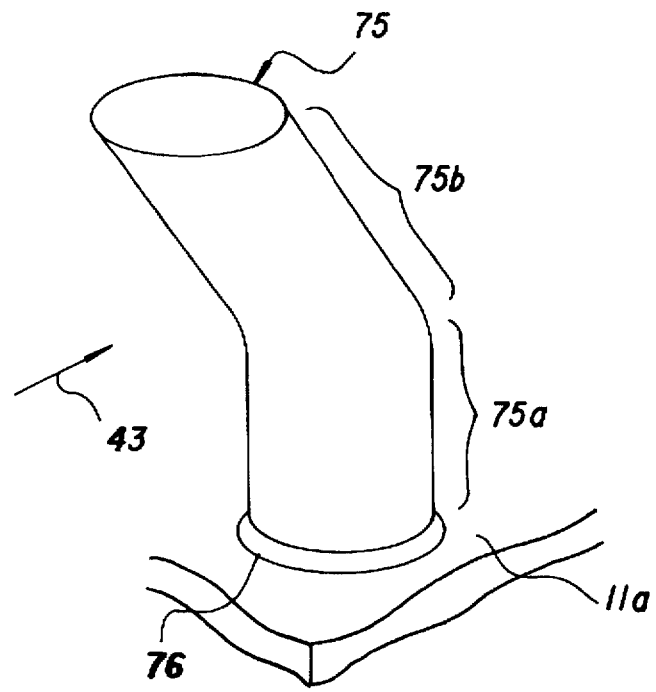
FIG. 10 is a perspective view showing a fourth modification of the radiator fin shown in FIG. 3.

FIG. 10 shows a fourth modification of the inclined columnar radiator fin. A columnar radiator fin 75 shown in FIG. 10 is made up of a base part 75a which is fixed vertically to the top surface 11a of the semiconductor element 11, and a bent part 75b which is bent to incline towards the upstream side of the parallel coolant flow 43.

According to the shape of this fourth modification of the inclined columnar radiator fin, the end surface of a connecting part 76 which is provided at the end of the base part 75a is perpendicular to the direction in which the base part 75a extends. For this reason, it is extremely simple to align the positions of the connecting part 76 and the top surface 11a of the semiconductor element 11 when assembling the columnar radiator fin 75, and the production efficiency is improved.

Figure 11:
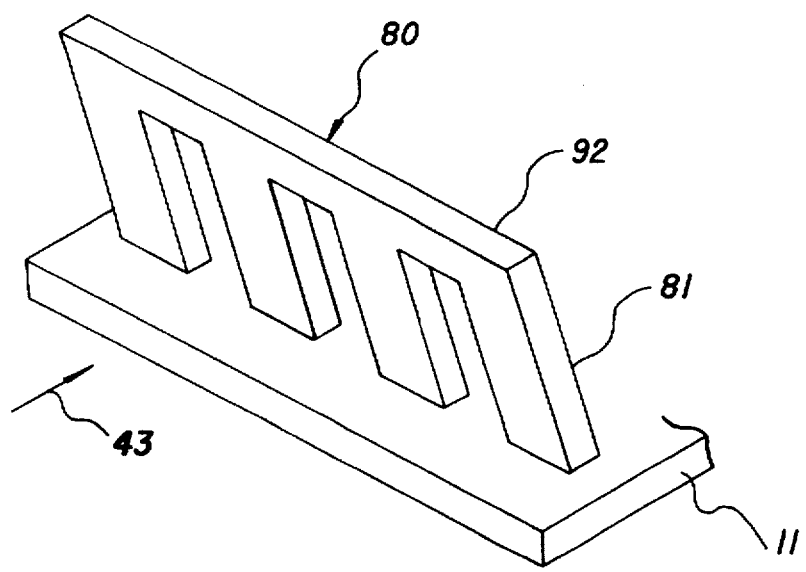
FIG. 11 is a perspective view showing a fifth modification of the radiator fin shown in FIG. 3.

FIG. 11 shows a fifth modification of the inclined columnar radiator fin. A comb shaped structure 80 shown in FIG. 11 is integrally formed from a plurality of inclined columnar radiator fin parts 81, and a connecting flange 82 which connects top ends of the inclined columnar radiator fin parts 81.

Figure 12A:
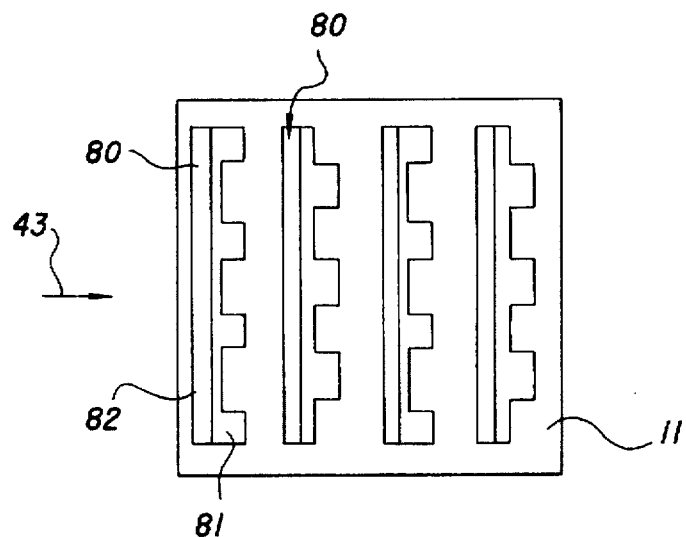
FIGS. 12A and 12B respectively are a plan view and a side view showing the radiator fin shown in FIG. 11 in the mounted state.
Figure 12B:
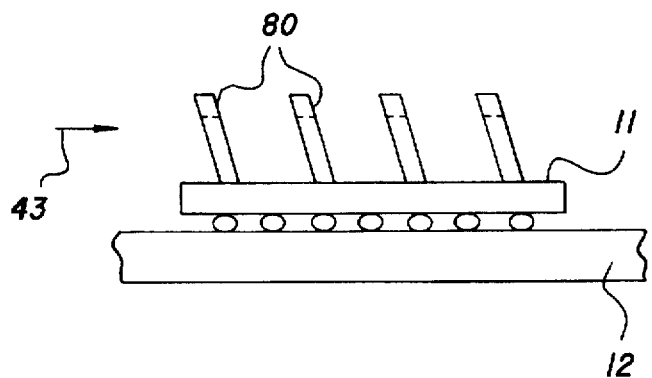

FIG. 12A shows a plan view of the comb shaped structures 80, and FIG. 12B shows a side view of the comb shaped structures 80. As shown in FIGS. 12A and 12B, each comb shaped structure 80 is made up of the inclined columnar radiator fin parts 81 which are integrally arranged in a direction generally perpendicular to the parallel coolant flow 43, and are inclined towards the upstream side of the parallel coolant flow 43.

According to this fifth modification of the inclined columnar radiator fin, a plurality of inclined columnar radiator fin parts 81 can be assembled in units of the comb shaped structures 80. For this reason, the production process is extremely simple compared to the case where the radiator fins must be fixed one at a time.

Figure 13:
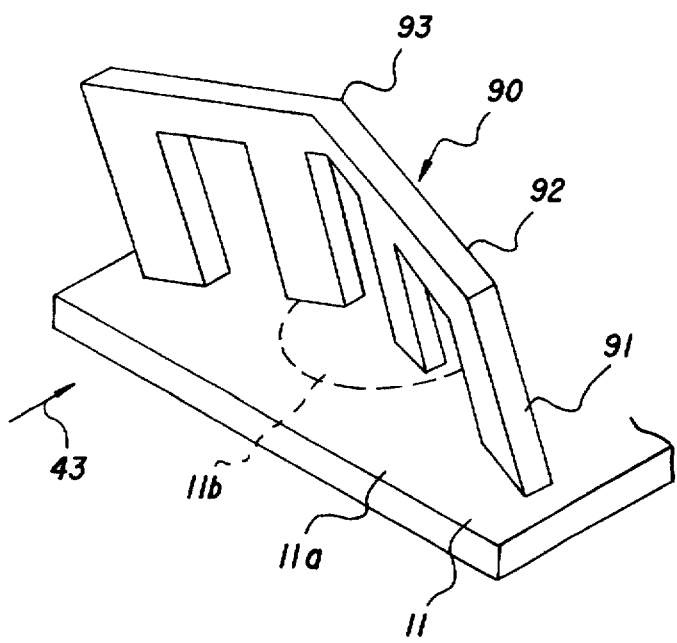
FIG. 13 is a perspective view showing a sixth modification of the radiator fin shown in FIG. 3.

FIG. 13 shows a sixth modification of the inclined columnar radiator fin. In this sixth modification, the connecting flange 82 of the comb shaped structure 80 shown in FIG. 11 is curved towards the downstream side of the parallel coolant flow 43. In other words, a comb shaped structure 90 shown in FIG. 13 is curved in an approximate V-shape, and is integrally formed from a plurality of inclined columnar radiator fins 91 and a connecting flange 92 which connect the top ends of the inclined columnar radiator fins 91.

Figure 14A:
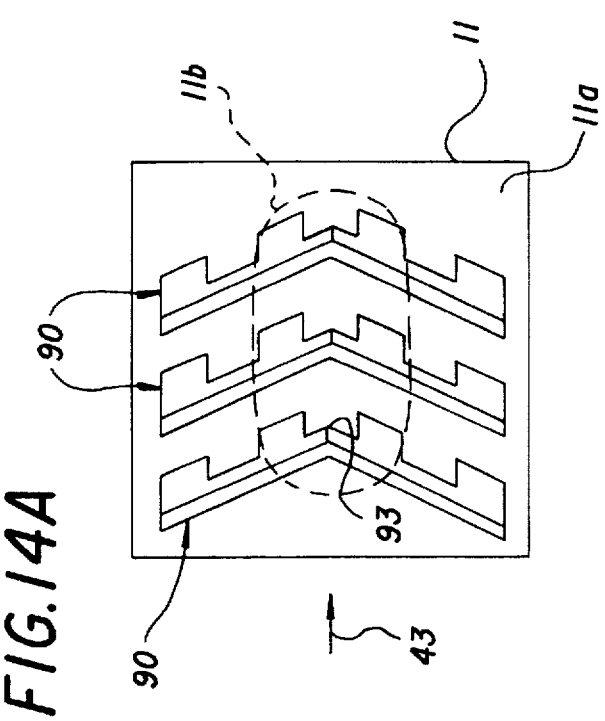
FIGS. 14A and 14B respectively are a plan view and a side view showing the radiator fin shown in FIG. 13 in the mounted state.
Figure 14B:
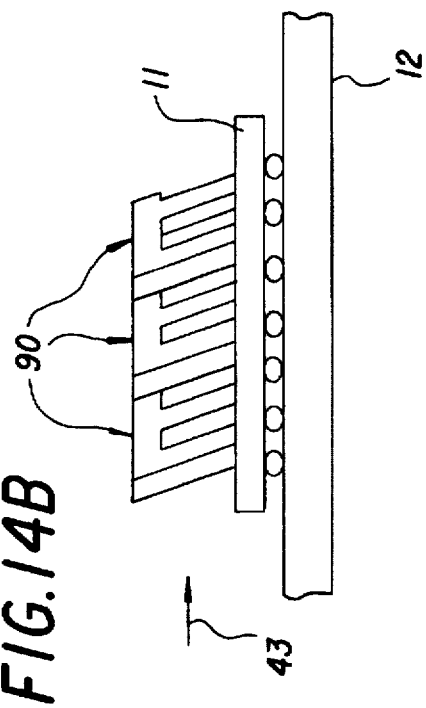

FIG. 14A shows a plan view of the comb shaped structures 90, and FIG. 14B shows a side view of the comb shaped structures. As shown in FIGS. 14A and 14B, each comb shaped structure 90 is curved to form an approximate V-shape which points towards the downstream side of the parallel coolant flow 43.

According to this sixth modification of the inclined columnar radiator fin, the downwardly inclined flow is generated in a vicinity of the inclined columnar radiator fin parts 91, and the curved shape of the comb shaped structure 90 acts so as to concentrate the parallel coolant flow 43 towards a most downstream side part 93 of the comb shaped structure 90. For this reason, it is possible to increase the amount of coolant passing above a region 11b of the top surface 11a in a vicinity of the most downstream side part 93 compared to that at other regions of the top surface 11a. Therefore, it is possible to effectively cool the specific region 11b more efficiently, such as a part of the semiconductor element 11 where the generated heat is high.

Next, a description will be given of modifications of the arrangement of the inclined columnar radiator fins 37 of the first embodiment. The arrangement of the inclined columnar radiator fins 37 will hereinafter simply be referred to as the "fin arrangement".

Figure 15A:
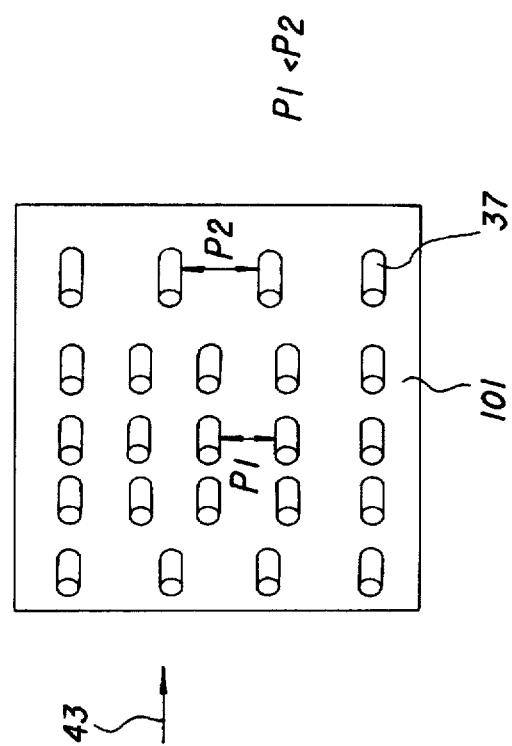
FIGS. 15A and 15B respectively are a plan view and a side view showing a first modification of the arrangement of the inclined columnar radiator fins.
Figure 15B:
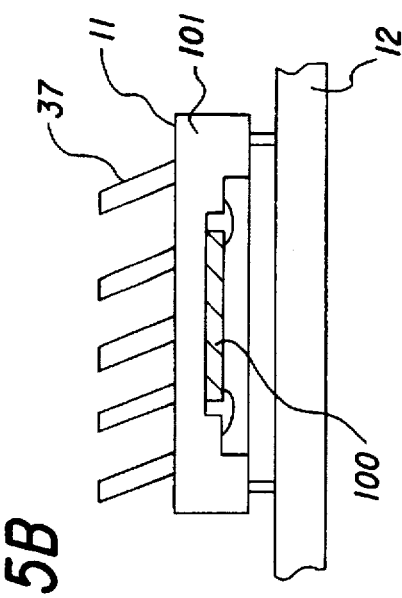

FIGS. 15A and 15B respectively show a plan view and a side view of a first modification of the fin arrangement. In FIGS. 15A and 15B, the inclined columnar radiator fins 37 are arranged at a pitch $P_1$ in an intermediate part of the semiconductor element 11 with respect to the parallel coolant flow 43, and this pitch $P_1$ is smaller than a pitch $P_2$ of the inclined columnar radiator fins 37 arranged at other parts of the semiconductor element 11.

According to this first modification of the fin arrangement, it is possible to efficiently cool a specific part of the semiconductor element 11. Hence, even in a case where the semiconductor element 11 is formed by a package 101 which accommodates a semiconductor chip 100 and the heat generated from the central part of the package 101 is high as shown in FIG. 15B, it is possible to uniformly and efficiently cool the semiconductor element 11.

Figure 16:
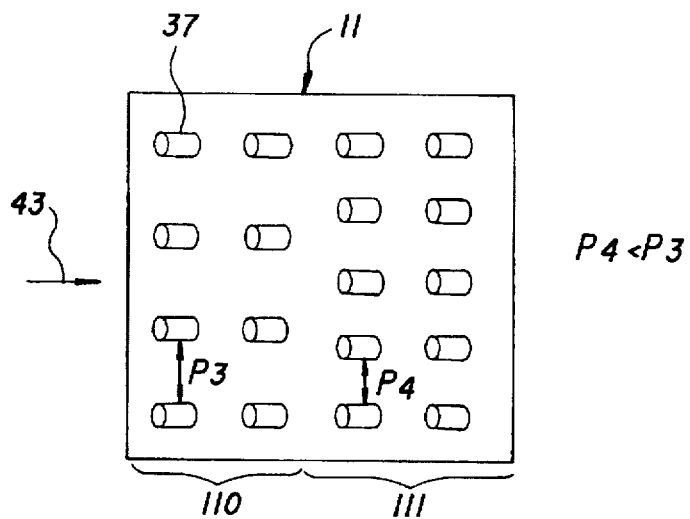
FIG. 16 is a plan view showing a second modification of the arrangement of the inclined columnar radiator fins.

FIG. 16 shows a plan view of a second modification of the fin arrangement. In FIG. 16, the inclined columnar radiator fins 37 are arranged at a pitch $P_4$ in a downstream side part 111 of the semiconductor element 11 with respect to the parallel coolant flow 43, and this pitch $P_4$ is smaller than a pitch $P_3$ of the inclined columnar radiator fins 37 arranged in an upstream side part 110 of the semiconductor element 11.

According to this second modification of the fin arrangement, the cooling efficiency of the semiconductor element 11 is improved at the downstream side part 111 compared to the upstream side part 110. On the other hand, the parallel coolant flow 43 is heated and the temperature thereof rises when passing above the semiconductor element 11, and the cooling capacity of the coolant itself gradually decreases towards the downstream side of the parallel coolant flow 43. For this reason, the effects of the two cancel each other, so that the entire semiconductor element 11 is cooled to an approximately uniform temperature.

This concept of cooling can also be applied to a case where a plurality of semiconductor elements are arranged along the direction of the coolant flow. In other words, it is possible to cool each of the semiconductor elements to an approximately uniform temperature by arranging the inclined columnar radiator fins at a narrower pitch for those semiconductor elements located closer to the downstream side of the coolant flow.

Next, a description will be given of the modifications of the fin arrangement in which different kinds of inclined columnar radiator fins are arranged on a single semiconductor element.

Figure 17:
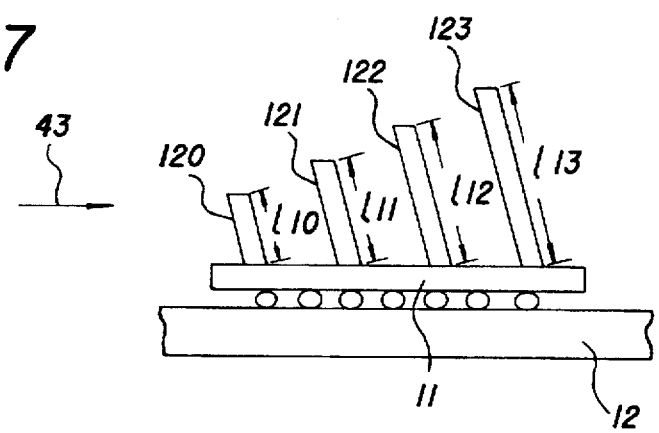
FIG. 17 is a side view showing the arrangement of inclined columnar radiator fins having different lengths.

FIG. 17 shows a fin arrangement in which the lengths of the inclined columnar radiator fins are longer towards the downstream side of the parallel coolant flow 43. In other words, lengths $l_{10}$, $l_{11}$, $l_{12}$ and $l_{13}$ of inclined columnar radiator fins 120, 121, 122 and 123 satisfy a relation $l_{10} < l_{11} < l_{12} < l_{13}$.

The cooling capacity of the inclined columnar radiator fin becomes greater as the length of the inclined columnar radiator fin becomes longer. Hence, the fin arrangement shown in FIG. 17 compensates for the decrease in the cooling capacity caused by the temperature rise of the parallel coolant flow 43 on the semiconductor element 11. As a result it is possible to cool the entire semiconductor element 11 to an approximately uniform temperature.

Figure 18:
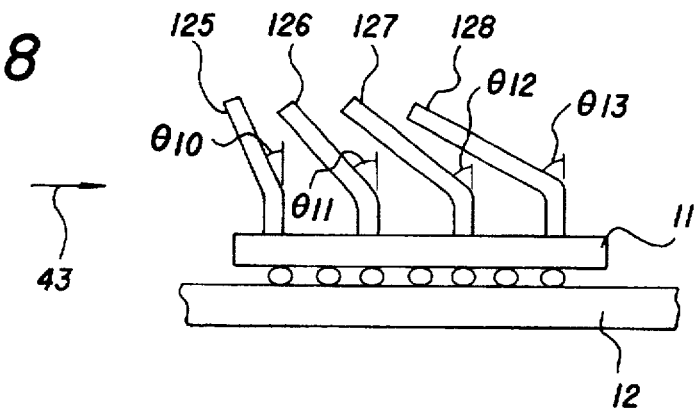
FIG. 18 is a side view showing the arrangement of inclined columnar radiator fins having different inclination angles.

FIG. 18 shows a fin arrangement in which the inclination angles of the inclined columnar radiator fins are greater towards the downstream side of the parallel coolant flow 43. In other words, inclination angles $\theta_{10}$, $\theta_{11}$, $\theta_{12}$ and $\theta_{13}$ of inclined columnar radiator fins 125, 126, 127 and 128 satisfy a relation $\theta_{10} < \theta_{11} < \theta_{12} < \theta_{13}$. In addition, the inclined columnar radiator fins 125 through 128 have approximately the same height. Consequently, the inclined columnar radiator fin with the greater inclination angle is also longer.

The cooling capacity of the inclined columnar radiator fin becomes greater as the length of the inclined columnar radiator fin becomes longer, and in addition, the effect of the means for obliquely hitting the coolant also becomes greater as the inclination angle of the inclined columnar radiator fin becomes larger. For this reason, the fin arrangement shown in FIG. 18 compensates for the decrease in the cooling capacity caused by the temperature rise of the parallel coolant flow 43 on the semiconductor element 11. As a result it is possible to cool the entire semiconductor element 11 to an approximately uniform temperature.

Furthermore, since the heights of the inclined columnar radiator fins 125 through 128 are approximately the same, the parallel coolant flow 43 hits all of the inclined columnar radiator fins 125 through 128, and the cooling capacity of the coolant is effectively utilized.

Next, a description will be given of a second embodiment of the semiconductor element cooling apparatus according to the present invention. In this second embodiment, the means for obliquely hitting the coolant is formed by a fan.

FIG. 19 shows the second embodiment. In FIG. 19, those parts which are the same as those corresponding parts in FIG. 3 are designated by the same reference numerals, and a description thereof will be omitted. Further, FIG. 20 shows a side view for explaining the relationship of the fan and the semiconductor element in FIG. 19.

In a semiconductor element cooling apparatus 130 shown in FIGS. 19 and 20, the semiconductor element 11 is mounted on the circuit substrate 12, and a heat sink 131 is provided on the semiconductor element 11.

A compact fan 133 forms an important part of this embodiment. This compact fan 133 is provided within the passage 33 and is located above the heat sink 131. In addition, the compact fan 133 is supported on the circuit substrate 12 by a support bracket 134 in an inclined position which has an inclination angle α of approximately 30° with respect to the circuit substrate 12.

Next, a description will be given of the cooling operation of the semiconductor element cooling apparatus 130.

The fan 35 and the compact fan 133 are driven. When the fan 35 is driven, the air is drawn in as the coolant via the coolant inlet 36, and the parallel coolant flow 43 which is parallel to the circuit substrate 12 is formed within the passage 33. On the other hand, when the compact fan 133 is driven, a parallel coolant flow portion 43-1 which is close to the passage forming member 32 out of the parallel coolant flow 43 is drawn in by the compact fan 133 and is ejected in the form of an ejected coolant flow portion 135 as indicated by an arrow. This ejected coolant flow portion 135 forms an angle α towards the downstream side of the parallel coolant flow 43 with respect to a line 138 which is perpendicular to the circuit substrate 12.

On the other hand, out of the parallel coolant flow 43, a parallel coolant flow portion 43-2 which is close to the circuit substrate 12 hits the heat sink 131. In addition, the above ejected coolant flow portion 135 also hits the heat sink 131. Hence, the heat of the heat sink 131 is absorbed by both the parallel coolant flow portion 43-2 and the ejected coolant flow portion 135, and the semiconductor element 11 is efficiently cooled.

Next, a description will be given of the advantages of providing the compact fan 131 in the inclined position.

First, it is possible to efficiently secure a draw-in area 136. Since the space between the passage forming member 32 and the compact fan 133 within the draw-in area 136 spreads towards the upstream side of the parallel coolant flow 43, it becomes easier to draw in the parallel coolant flow 43.

Second, the ejected coolant flow portion 135 is inclined towards the downstream side of the parallel coolant flow 43. For this reason, the ejected coolant flow portion 135 after hitting the heat sink 131 more easily flows to the downstream side of the parallel coolant flow 43 as indicated by an arrow 137, and is unlikely to interfere with the flow of the parallel coolant flow 43.

Third, the ejected coolant flow portion 135 after hitting the heat sink 131, indicated by the arrow 137, acts to increase the flow velocity of the parallel coolant flow 43. As the flow velocity of the parallel coolant flow 43 increases, the cooling efficiency improves.

Next, a description will be given of modifications of the second embodiment described above.

FIG. 21 shows a first modification of the second embodiment.

In FIG. 21, a guide plate 140 is provided on the downstream side of the compact fan 133. Out of the ejected coolant flow portion 135 from the compact fan 133, the guide plate 140 forcibly guides an ejected coolant flow portion 135-1 which is pushed towards the downstream side of the parallel coolant flow 43 and would otherwise not reach the heat sink 131, as indicated by an arrow 135-2, so as to reach the heat sink 131. This first modification is particularly effective when the height of the passage of the parallel coolant flow 43 is restricted and the compact fan 133 must be inclined by a large angle.

According to this first modification, it is possible to efficiently cool the semiconductor element 11.

Figure 22:
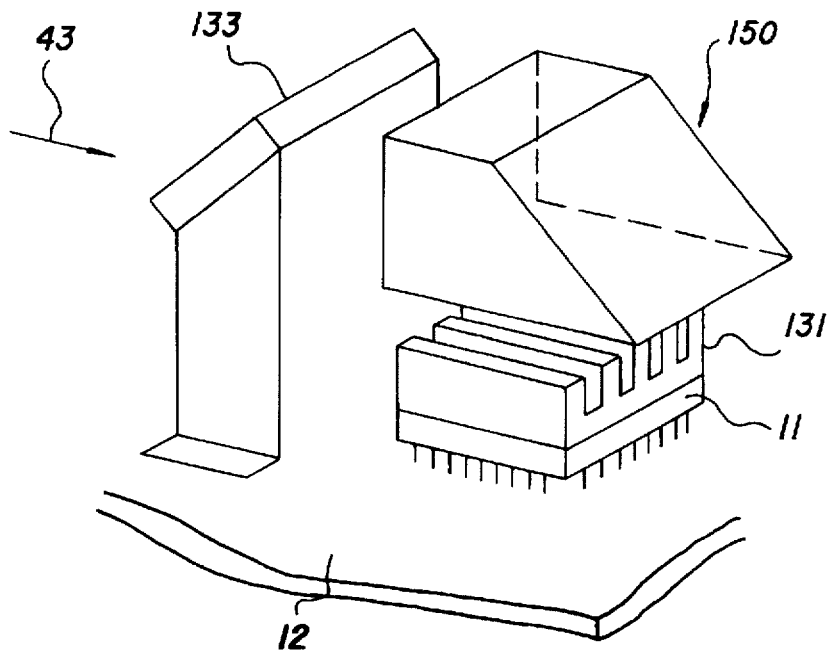
FIG. 22 is a perspective view showing a second modification of the second embodiment.

FIG. 22 shows a second modification of the second embodiment.

In FIG. 22, a guide duct 150 is provided in place of the guide plate 140 shown in FIG. 21. Compared to the guide plate 140 of the first modification, the provision of the guide duct 150 increases the amount of coolant flow hitting the heat sink 131, thereby further improving the cooling efficiency.

Figure 23:
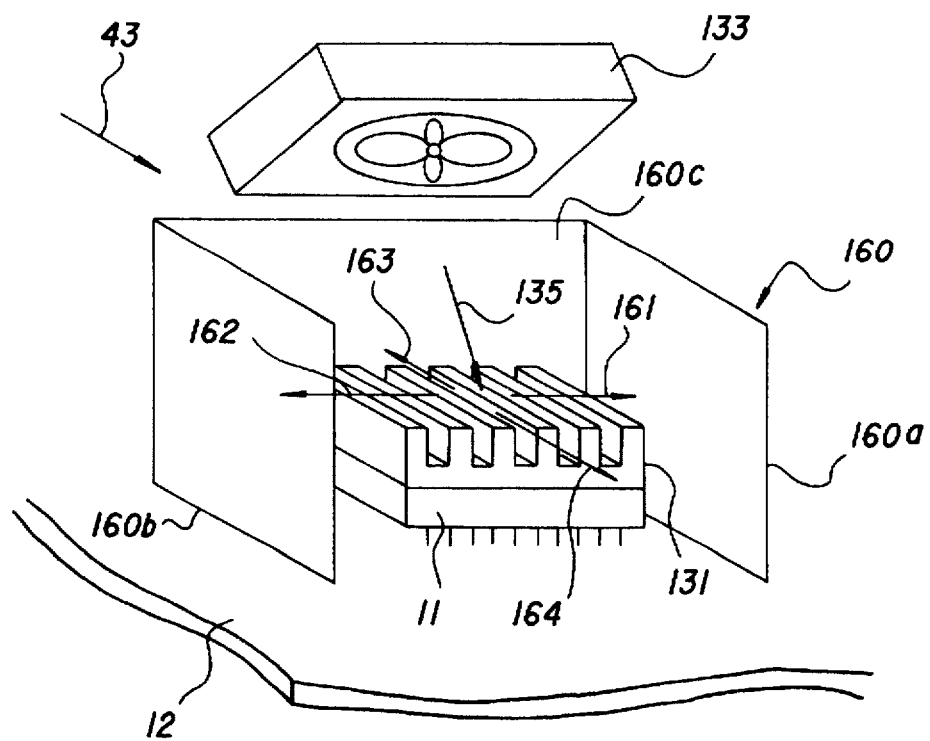
FIG. 23 is a perspective view showing a third modification of the second embodiment.

FIG. 23 shows a third modification of the second embodiment.

In FIG. 23, a guide member 160 made up of wall portions 160a, 160b and 160c and having an approximate U-shape is additionally provided in the semiconductor element cooling apparatus 130 shown in FIGS. 19 and 20. This guide member 160 is provide on the circuit substrate 12 so as to generally surround the semiconductor element 11.

By the provision of the guide member 160, the coolant flow which is directed towards the heat sink 131 by the compact fan 133 is restricted from spreading to the right and left and to the upstream direction when viewed in the flow direction of the parallel coolant flow 43, as indicated by arrows 161, 162 and 163. As a result, the coolant flows only in the downstream direction of the parallel coolant flow 43 as indicated by an arrow 164.

According to this third modification, it is possible to prevent undesirable effects to other circuit elements on the periphery of the semiconductor element 11.

Figure 24:
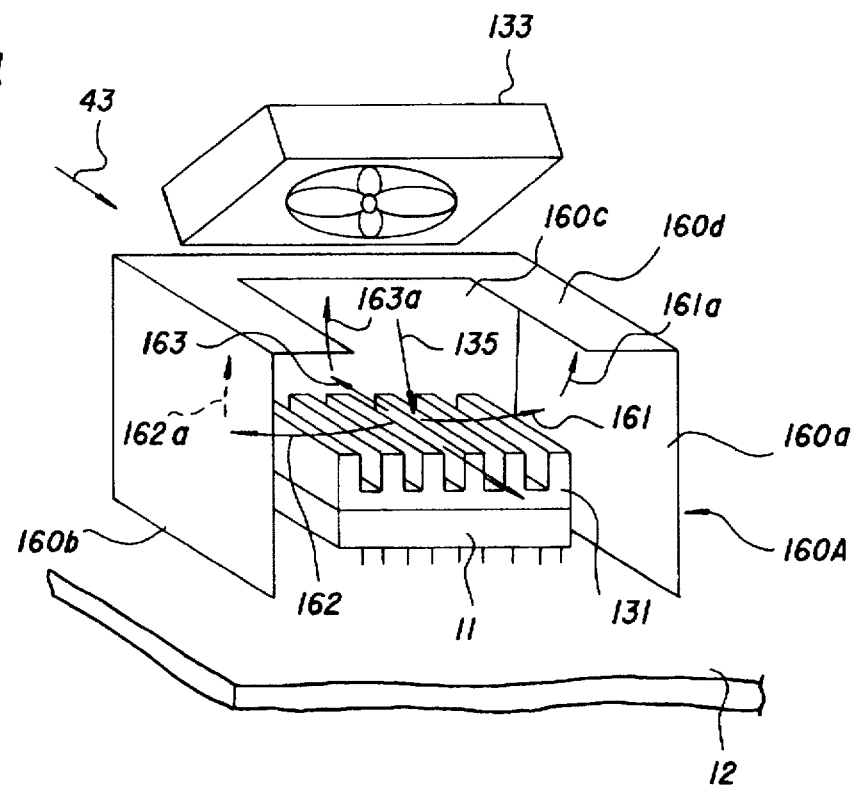
FIG. 24 is a perspective view showing a fourth modification of the second embodiment.

FIG. 24 shows a fourth modification of the second embodiment.

In FIG. 24, a guide member 160A has a flange portion 160d along the upper end of the guide member 160 shown in FIG. 23. In other words, the flange portion 160d extends along the upper end of the guide member 160A and projects to the inside.

By the provision of the flange portion 160d, even if coolant flows 161a, 162a and 163a are generated and move upwardly along the respective wall portions 160a, 160b and 160c, the coolant flows 161a, 162a and 163a hit the flange portion 160d and is prevented from escaping upwardly of the guide member 160A.

Therefore, the coolant which has absorbed heat and flows upwardly will not move around to the draw-in side of the compact fan 133 and raise the temperature of the ejected coolant flow portion 135. Hence, this fourth modification can prevent the cooling effect from deteriorating due to the coolant which may otherwise reach the draw-in side of the compact fan 133 if the flange portion 160d is not provided.

Figure 25:
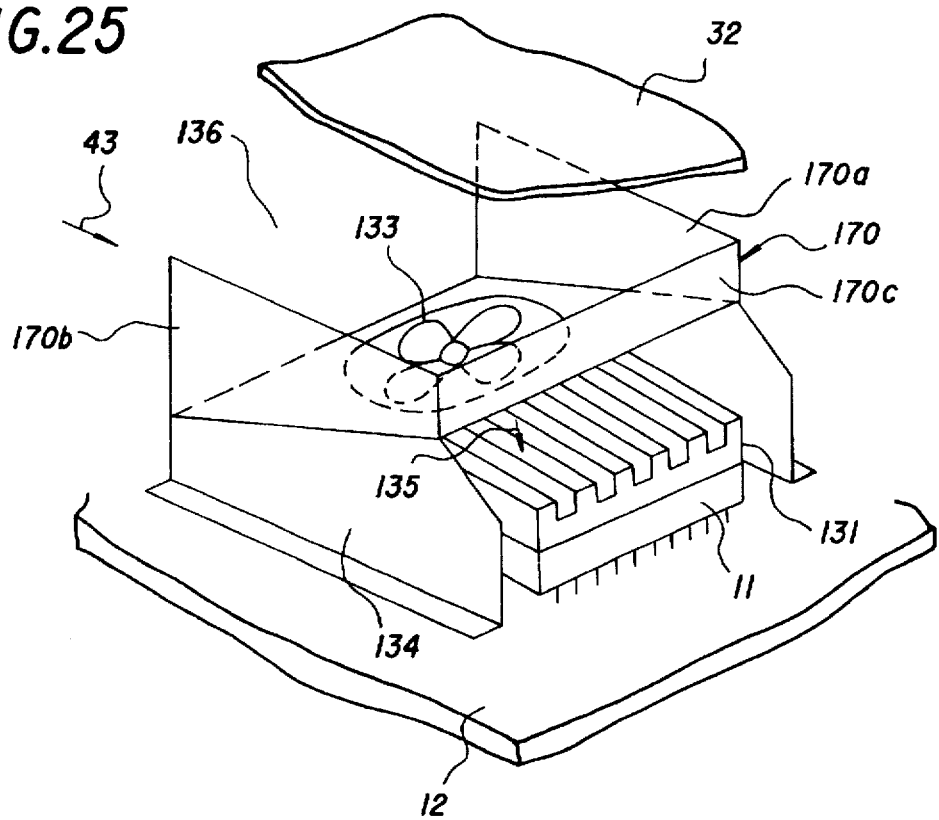
FIG. 25 is a perspective view showing a fifth modification of the second embodiment.

FIG. 25 shows a fifth modification of the second embodiment.

In FIG. 25, the compact fan 133 is supported on the circuit substrate 12 by the support bracket 134. In addition, a partition member 170 is provided between the support bracket 134 and the passage forming member 32. The partition member 170 is made up of left and right sidewalls 170a and 170b, and a wall 170c on the downstream side of the compact fan 133. The partition member 170 has an approximate U-shape and surrounds the compact fan 133 except for the draw-in area 136.

The partition member 170 partitions the draw-in side and the ejection side of the compact fan 133, so as to prevent the ejected coolant flow portion 135 from moving around to the draw-in side. In addition, the provision of the partition member 170 enables mounting of a stable fan which is strong against vibration and shock.

Similarly to the fourth modification, this fifth modification provides an effective means of preventing the heated coolant from moving around to the draw-in side of the compact fan 133 when the ejected coolant flow portion 135 from the compact fan 133 is strong relative to the parallel coolant flow 43.

Figure 26:
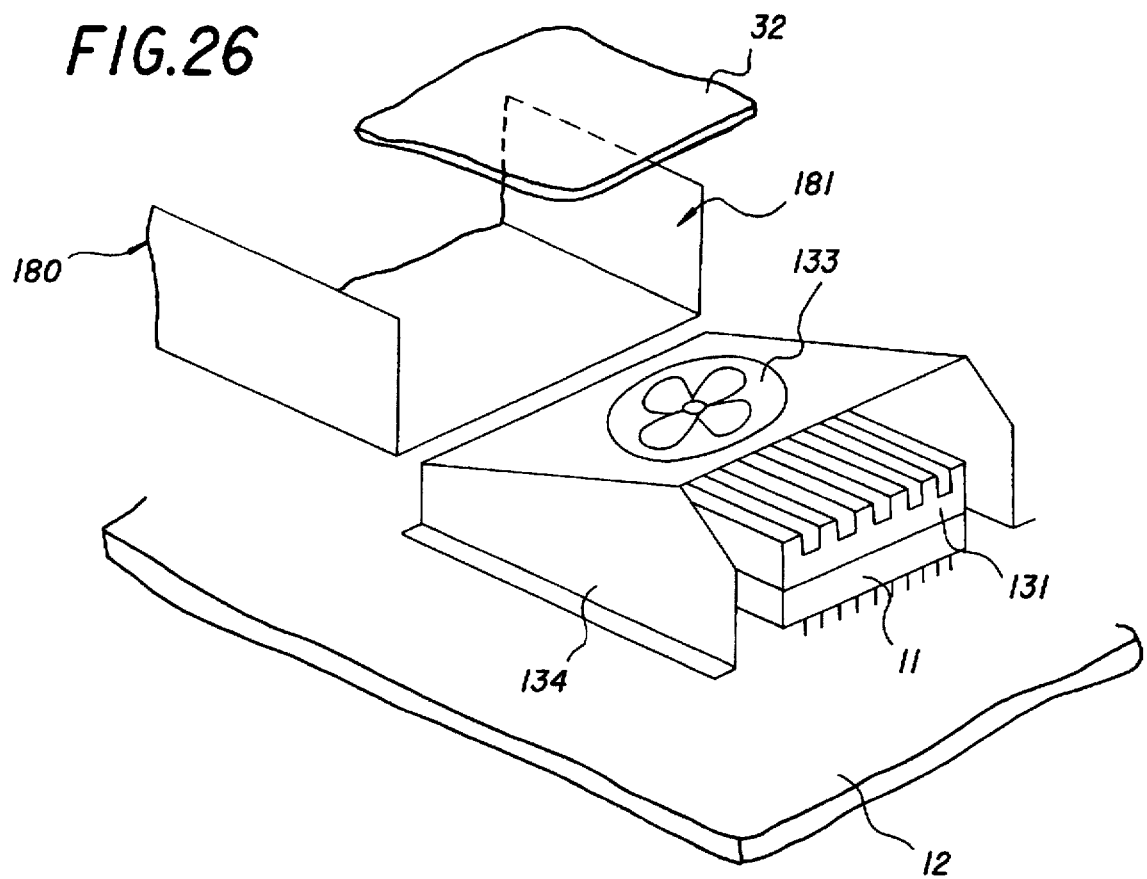
FIG. 26 is a perspective view showing a sixth modification of the second embodiment.
Figure 27:
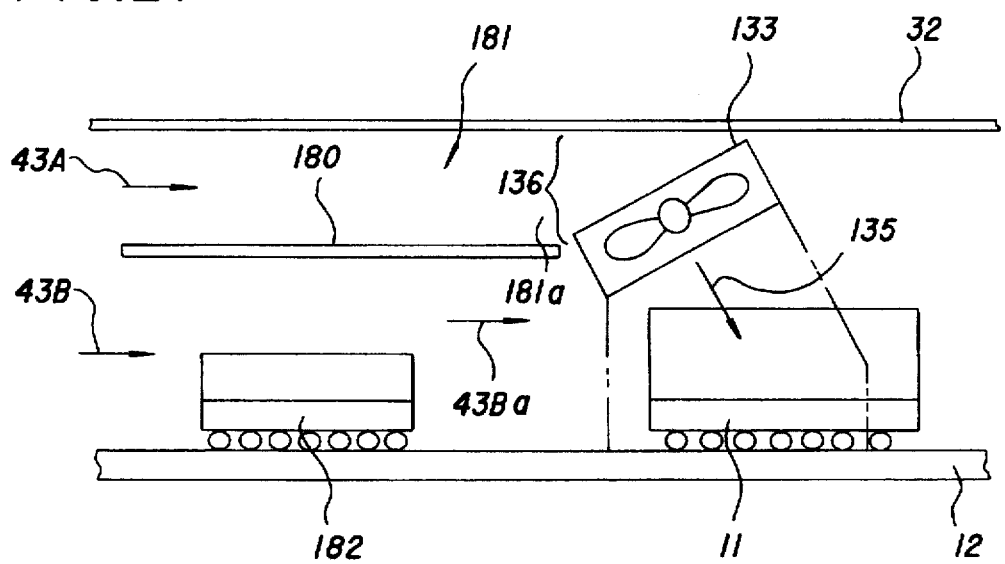
FIG. 27 is a side view showing the sixth modification shown in FIG. 26.

FIGS. 26 and 27 show a sixth modification of the second embodiment.

In FIGS. 26 and 27, a duct forming member 180 is provided at a position in a vicinity of the passage forming member 32 within the passage 33. The duct forming member 180 and the passage forming member 32 form a duct 181.

An opening 181a at one end of the duct 181 opens to the draw-in area 136 of the compact fan 133. The other open end (not shown) of the duct 181 opens for example to the coolant inlet 36 of the passage 33 shown in FIG. 19. A parallel coolant flow is also generated within the duct 181 by the fan 35 shown in FIG. 19, similarly to the inside of the passage 33. The parallel coolant flow within the duct 181 is indicated by a reference numeral 43A, and the parallel coolant flow outside the duct 181 is indicated by a reference numeral 43B.

Next, a description will be given of the duct 181.

The compact fan 133 draws in and ejects only the parallel coolant flow 43A which is received via the duct 181.

On the other hand, the duct 181 prevents the draw-in force of the compact fan 133 from affecting the parallel coolant flow 43B. A semiconductor element 182 shown in FIG. 27 is located at a position immediately in front of the semiconductor element 11 in the flow direction of the parallel coolant flow 43. Hence, the compact fan 133 will not draw in the parallel coolant flow 43B for cooling the semiconductor element 182 and give undesirable effects on the air surrounding the semiconductor element 182. In addition, it is also possible to prevent a parallel coolant flow 43Ba which passes the semiconductor element 182 and is heated thereby from being drawn in by the compact fan 133, and thus, the temperature of the air ejected from the compact fan 133 will not be increased by the parallel coolant flow 43Ba.

Therefore, this sixth modification can not only efficiently cool the semiconductor element 11, but also cool the semiconductor element 182 without being affected by the cooling of the semiconductor element 11.

Next, a description will be given of a third embodiment of the semiconductor element cooling apparatus according to the present invention.

Figure 28:
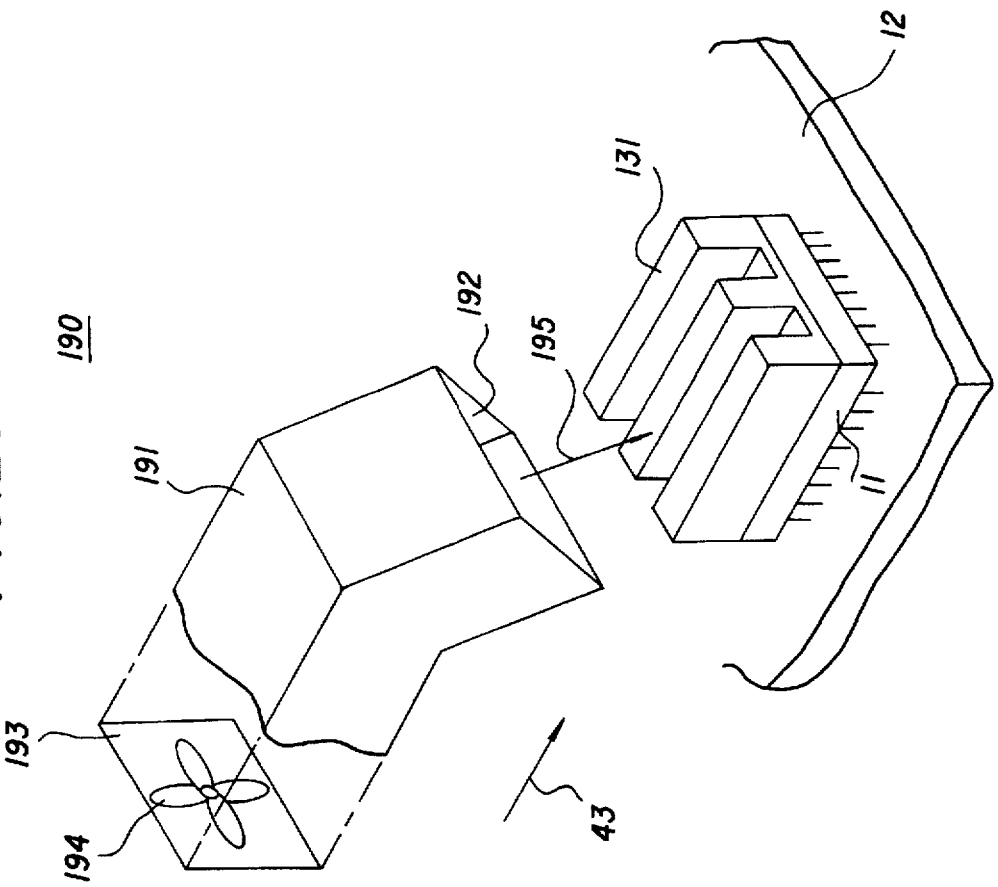
FIG. 28 is a perspective view showing a third embodiment of the semiconductor element cooling apparatus according to the present invention.

FIG. 28 shows the third embodiment. In a semiconductor element cooling apparatus 190 shown in FIG. 28, a duct forms the means for obliquely hitting the coolant.

In FIG. 28, the semiconductor element 11 is mounted on the circuit substrate 12, and the heat sink 131 is provided on this semiconductor element 11. A duct 191 has an outlet 192 which is arranged obliquely to the semiconductor element 11. A compact fan 194 is mounted at an inlet 193 of this duct 191.

The parallel coolant flow 43 and an ejected coolant flow 195 which is ejected obliquely from the outlet 192 of the duct 191 hit the semiconductor element 11. Hence, the semiconductor element 11 is efficiently cooled for reasons similar to the case where the compact fan 133 is obliquely arranged as described above.

Next, a description will be given of a fourth embodiment of the semiconductor element cooling apparatus according to the present invention.

Figure 29:
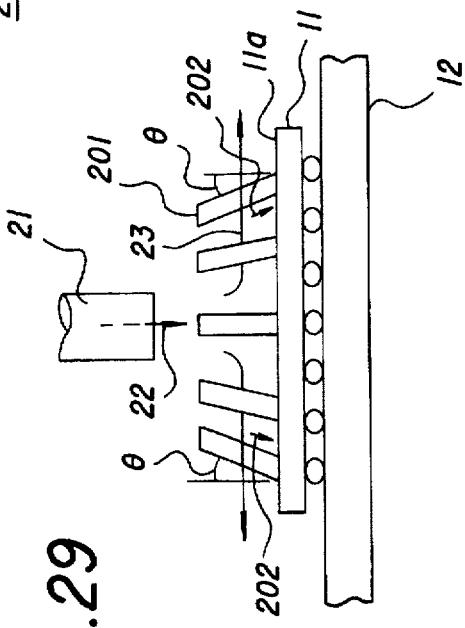
FIG. 29 is a side view showing a fourth embodiment of the semiconductor element cooling apparatus according to the present invention.
Figure 30:
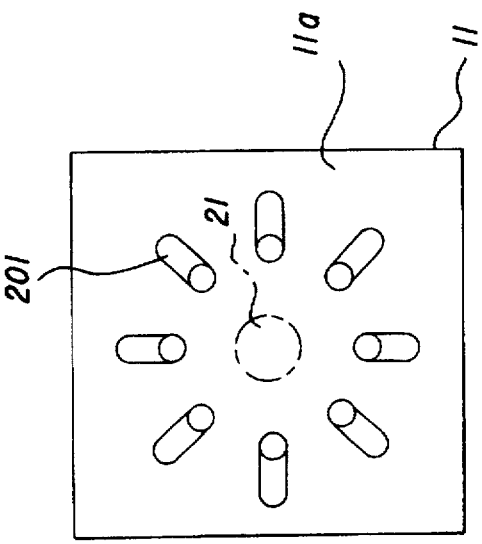
FIG. 30 is a plan view showing the fourth embodiment shown in FIG. 29.

FIGS. 29 and 30 show the fourth embodiment. In a semiconductor cooling apparatus 200 shown in FIGS. 29 and 30, inclined columnar radiator fins which are inclined towards the upstream side of the coolant flow form the means for obliquely hitting the coolant, similarly to the first embodiment. However, this fourth embodiment obtains the coolant flow by a coolant ejected from the nozzle.

In FIGS. 29 and 30, a plurality of inclined columnar radiator fins 201 are arranged on the top surface 11a of the semiconductor element 11, concentrically about a center of the semiconductor element 11. In addition, the inclined columnar radiator fins 201 are inclined at an angle θ towards the center of the semiconductor element 11. The nozzle 21 is provided above the semiconductor element 11 so as to confront the top surface 11a of the semiconductor element 11.

The high-speed coolant flow 22 ejected from the nozzle 21 at a high speed hits the center of the top surface 11a of the semiconductor element 11, and thereafter forms the jet flow 23 which spreads radially along the top surface 11a. This radial jet flow 23 absorbs the heat from the top surface 11a and the inclined columnar radiator fins 201, and cools the semiconductor element 11.

Each of the inclined columnar radiator fins 201 are inclined towards the upstream side of the radial jet flow 23. For this reason, a downward flow 202 is generated similarly to the first embodiment, and stimulates the coolant flow at the top surface 11a of the semiconductor element 11. In addition, the surface area of the inclined columnar radiator fin 202 is increased. As a result, it is possible to improve the cooling efficiency with respect to the semiconductor element 11.

Next, a description will be given of a fifth embodiment of the semiconductor element cooling apparatus according to the present invention.

Figure 31:
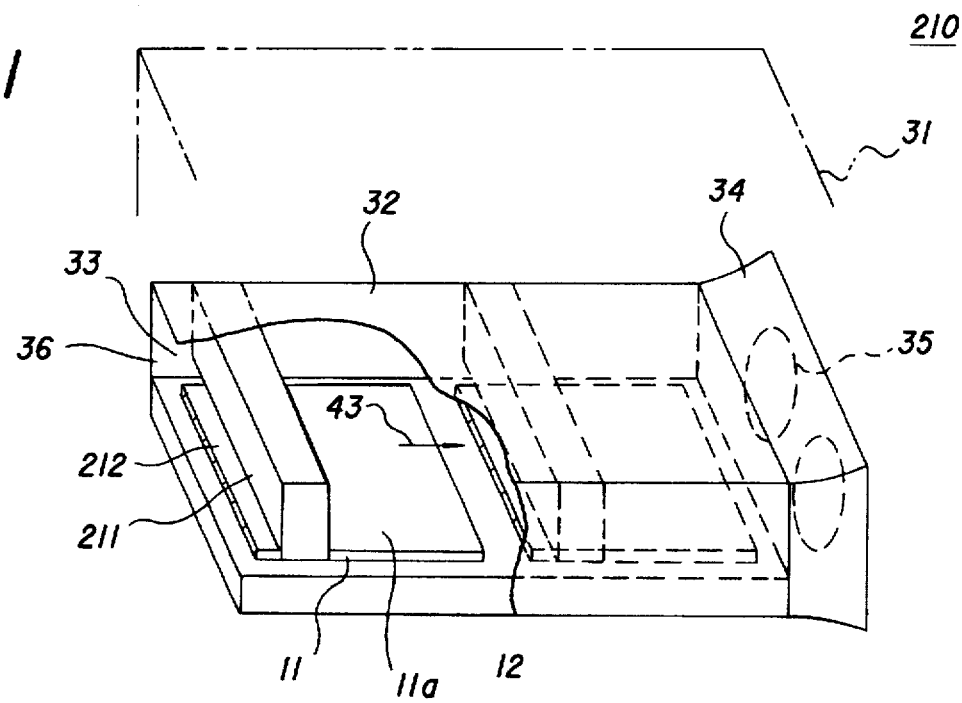
FIG. 31 is a perspective view, with a part cut away, showing a fifth embodiment of the semiconductor element cooling apparatus according to the present invention.
Figure 32:
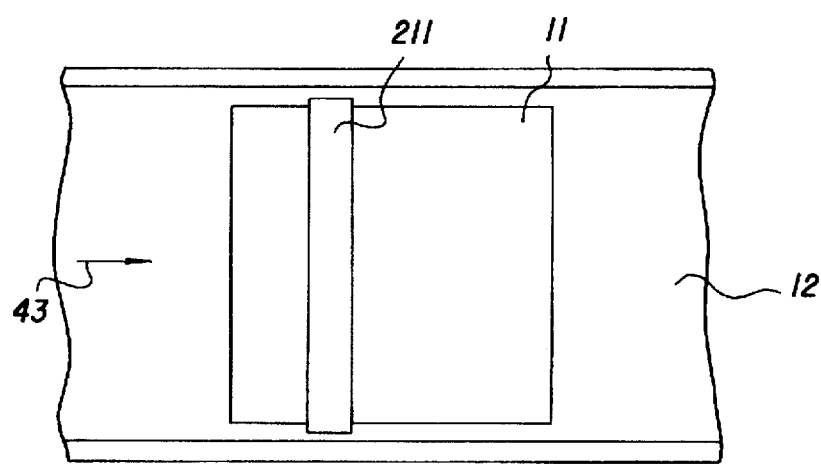
FIG. 32 is a plan view showing an important part of the fifth embodiment shown in FIG. 31.
Figure 33:
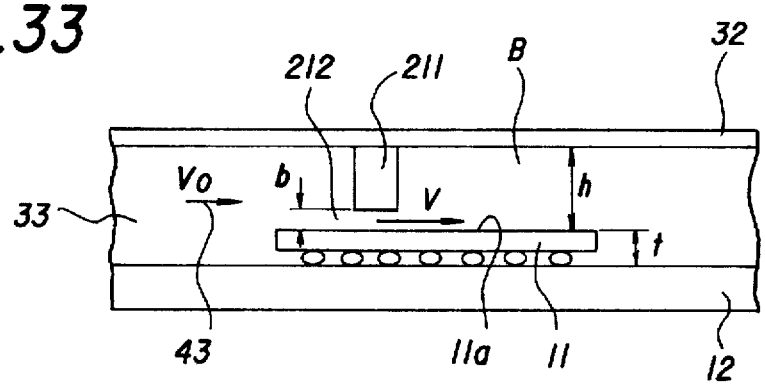
FIG. 33 is a front view showing an important part of the fifth embodiment shown in FIG. 31.
Figure 34:
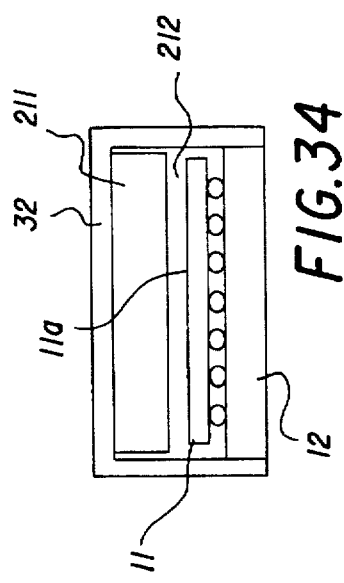
FIG. 34 is a diagram showing the fifth embodiment shown in FIG. 31 viewed from the direction of the flow of the coolant.
Figure 35:
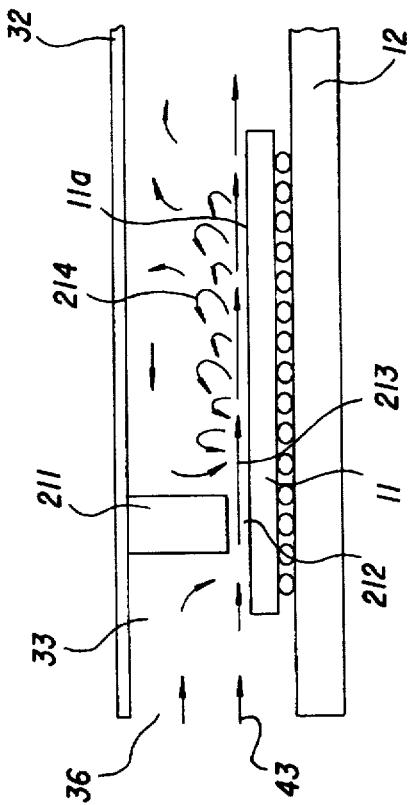
FIG. 35 is a side view for explaining the operation of the fifth embodiment shown in FIG. 31.

FIGS. 31 through 35 show the fifth embodiment. FIG. 31 is a perspective view, with a part cut away, showing the fifth embodiment. FIG. 32 is a plan view showing an important part of the fifth embodiment shown in FIG. 31. FIG. 33 is a front view showing an important part of the fifth embodiment shown in FIG. 31. FIG. 34 is a diagram showing the fifth embodiment shown in FIG. 31 viewed from the direction of the flow of the coolant. Further, FIG. 35 is a side view for explaining the operation of the fifth embodiment shown in FIG. 31. In FIGS. 31 through 35, those parts which are the same as those corresponding parts in FIG. 3 are designated by the same reference numerals, and a description thereof will be omitted.

In FIGS. 31 through 35, a partition member 211 is provided on the passage forming member 32 confronting the top surface 11a of the semiconductor element 11, for a length corresponding to approximately the full width of the flow in a direction generally perpendicular to the parallel coolant flow 43. The partition member 211 confronts a part of the top surface 11a on the upstream side of the semiconductor element 11. A narrow gap is formed between the partition member 211 and the top surface 11a of the semiconductor element 11, and functions as a slit-shaped coolant outlet 212.

During operation of the electronic equipment, the fan 35 which is used as the coolant driving unit is driven. As a result, the air is drawn in as the coolant from the coolant inlet 36, and the parallel coolant flow 43 is generated within the passage 33. FIG. 35 shows the flow in the vicinity of the semiconductor element 11 caused by the parallel coolant flow 43. In FIG. 35, the arrows generally show the velocity distribution of the coolant flow within the passage 33.

The flow quantity of the parallel coolant flow 43 is constant at an arbitrary cross section of the passage 33. Hence, the coolant flow is accelerated when entering within the gap between the top surface 11a of the semiconductor element 11 and the partition member 211 which narrows the cross section of the passage 33, and an extremely high-speed flow 213 is generated. This high-speed flow 213 is ejected at the high speed from the slit-shaped coolant outlet 212 for the entire width thereof, and forms a two-dimensional jet flow 214 on the top surface 11a of the semiconductor element 11 on the downstream side of the partition member 211.

As a result, the high-speed flow 213 in contact with the top surface 11a of the semiconductor element 11 efficiently absorbs the heat from the semiconductor element 11. In addition, extremely complex flows accompanying air eddy of various sizes are generated in the region of the two-dimensional jet flow 214, and the coolant is violently mixed, thereby stimulating the convection heat transfer within the coolant. Because of these effects, the cooling efficiency of the semiconductor element 11 is further improved.

Furthermore, although utilizing the high cooling efficiency of such a jet flow, this embodiment does not require a nozzle structure as in the conceivable case. For this reason, it is possible to mount a plurality of circuit substrates 12 or semiconductor elements 11 at a narrow pitch within the electronic equipment, that is, with a high mounting density, and cool the semiconductor elements 11 similarly to the normal cooling using the parallel coolant flow 43.

The effect of improving the cooling efficiency becomes greater as the flow velocity of the high-speed flow 213 becomes faster. The flow velocity v can be adjusted by the height b of the slit-shaped coolant outlet 212. In other words, the following formula (1) stands between the flow velocity v and the height b, where h denotes the gap between the top surface 11a of the semiconductor element 11 and the surface of the passage forming member 32, t denotes the height of the semiconductor element 11 in the mounted state, and $v_0$ denotes an average flow velocity of the parallel coolant flow 43 at a position in front of the semiconductor element 11.

$$v=[h+t]/b \cdot v_0 \quad (1)$$

However, when the flow velocity is increased, the pressure loss of the coolant also increases at the downstream side of the semiconductor element 11 when compared to that at the upstream side of the semiconductor element 11, and the load on the coolant driving unit 35 accordingly increases. Hence, from the practical point of view, it is necessary to appropriately set the value of the height b within a range such that a sufficiently large flow velocity v that would develop disturbed flow having air eddy of various sizes can be obtained in the region of the two-dimensional jet flow 214.

In addition, similarly as in the case of the first embodiment, the kind of semiconductor element 11, the kind of coolant used, the method of forming each surface of the passage forming member 32 may be selected arbitrarily, so that the above described effects are obtainable.

Next, a description will be given of modifications of the fifth embodiment.

Figure 36:
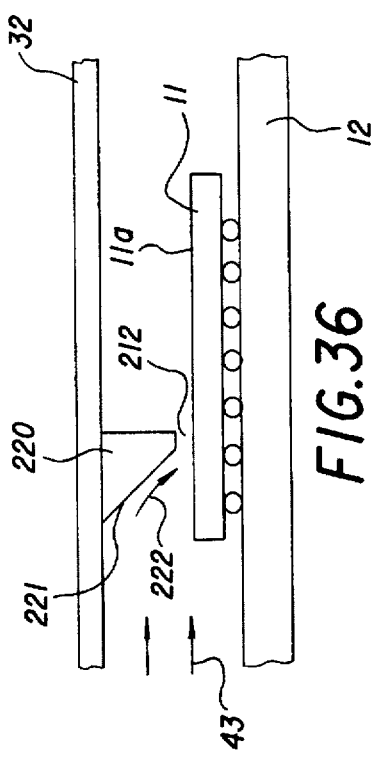
FIG. 36 is a side view showing a first modification of the fifth embodiment.

FIG. 36 shows a first modification of the fifth embodiment. A partition member 220 shown in FIG. 36 has an inclined surface 221 on the upstream side thereof. When viewed from the passage forming member 32, the surface 221 is inclined towards the downstream side of the parallel coolant flow 34. In this modification, the entire surface 221 is inclined.

According to this first modification, the parallel coolant flow 43 is guided by the inclined surface 221 as indicated by an arrow 222 and is smoothly guided towards the slit-shaped coolant outlet 212. For this reason, the coolant flow in the vicinity of the upstream side of the partition member 220 is smooth, and it is possible to reduce the pressure loss.

Figure 38:
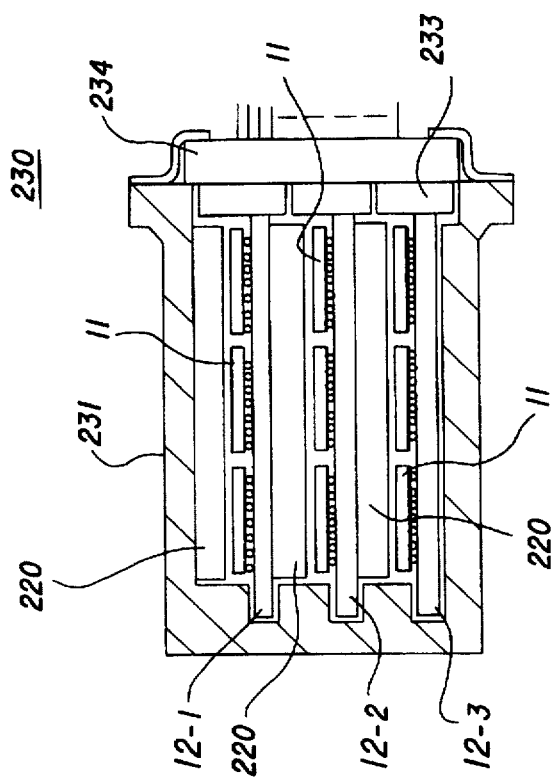
FIG. 38 is a cross sectional view along a line XXXVI—XXXVI in FIG. 37.
Figure 37:
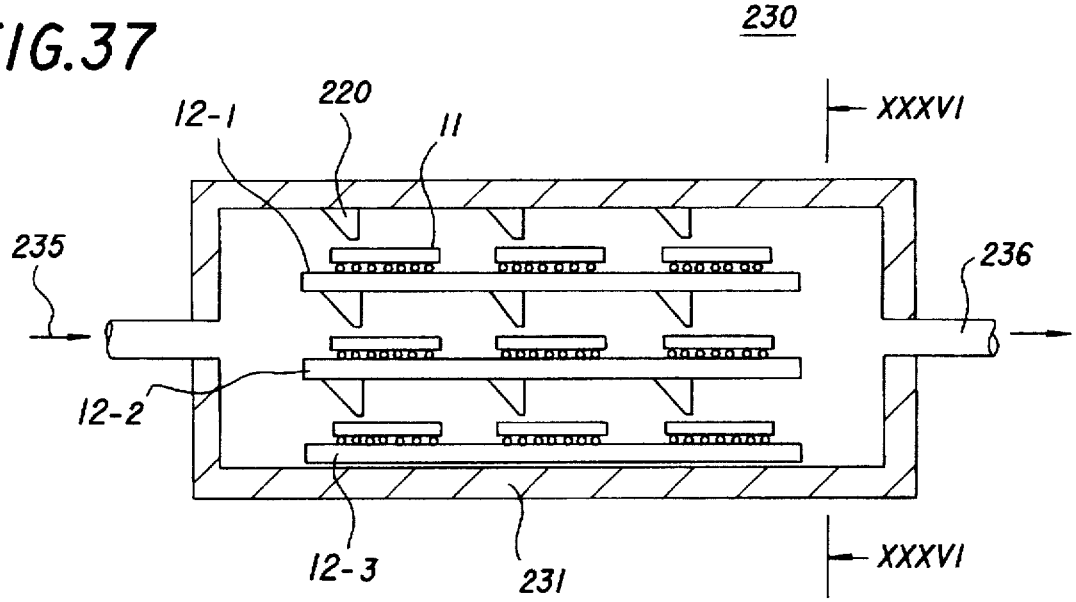
FIG. 37 is a cross sectional view showing a circuit substrate module applied with the first modification of the fifth embodiment shown in FIG. 36.

FIGS. 37 and 38 show an application of this first modification to a circuit substrate module 230. FIG. 37 shows a cross section of the circuit substrate module 230, and FIG. 38 shows a cross section taken along a line XXXVI—XXXVI in FIG. 37.

In FIGS. 37 and 38, a plurality of circuit substrates 12-1, 12-2 and 12-3 are accommodated within a sealed container 231. The circuit boards 12-1, 12-2 and 12-3 are coupled to a mother board 234 via a connector 233 as shown in FIG. 38. A plurality of semiconductor elements 11 are mounted on each of the circuit substrates 12-1, 12-2 and 12-3 in a matrix arrangement. Each partition member 220 is mounted on the adjacent circuit substrate so as to confront the semiconductor elements 11 on the circuit substrates 12-1, 12-2 and 12-3. With respect to the uppermost circuit substrate 12-1, the partition member 220 is mounted on the inner wall of the sealed container 231.

Before passing inside the sealed container 231 and reaching an outlet 236, a coolant 235 hits the partition members 220 and forms the two-dimensional jet flow on the downstream side of each partition member 220. Hence, the semiconductor elements 11 are efficiently cooled. In other words, this first modification can utilize the high cooling efficiency of the jet flow and also increase to the limit the mounting density of the semiconductor elements 11 within the electronic equipment.

Figure 39:
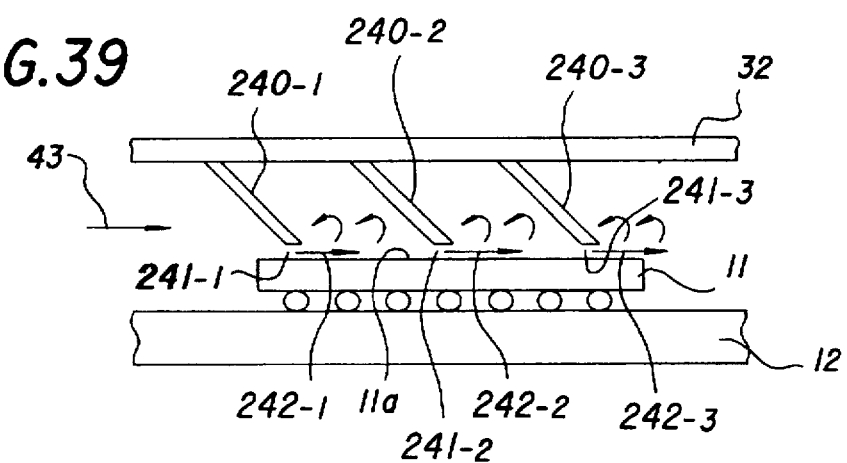
FIG. 39 is a side view showing a second modification of the fifth embodiment.

FIG. 39 shows a second modification of the fifth embodiment.

As shown in FIG. 39, a plurality of partition members 240-1, 240-2 and 240-3 are provided with respect to one semiconductor element 11. The partition members 240-1, 240-2 and 240-3 are arranged in the direction of the parallel coolant flow 43 at arbitrary intervals. Slit-shaped coolant outlets 241-1, 241-2 and 241-3 are formed between the semiconductor element 11 and the corresponding partition members 240-1, 240-2 and 240-3, and two-dimensional jet flows 242-1, 242-2 and 242-3 are formed on the downstream sides of the corresponding slit-shaped coolant outlets 241-1, 241-2 and 241-3. For this reason, the entire surface of the semiconductor element 11 is uniformly cooled with a satisfactory efficiency.

Figure 40:
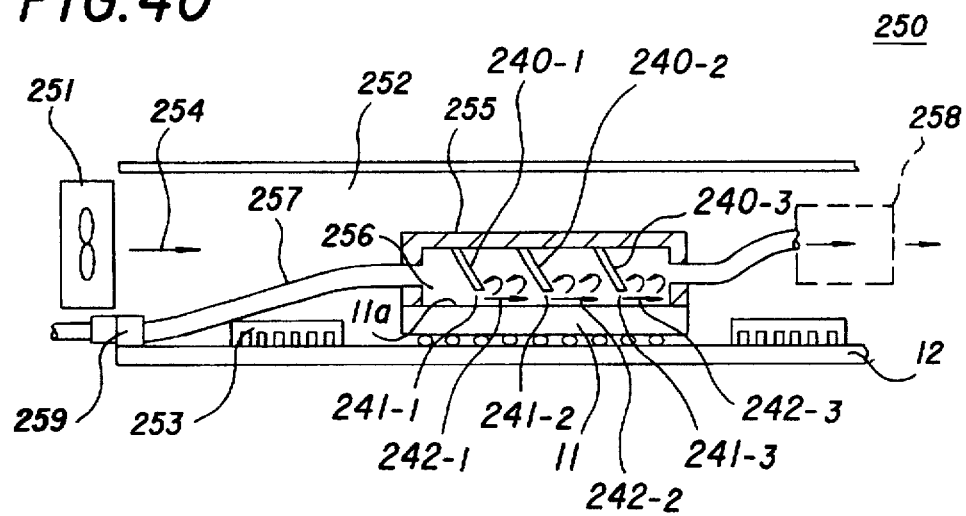
FIG. 40 is a cross sectional view showing an electronic equipment applied with the second modification of the fifth embodiment shown in FIG. 39.

FIG. 40 shows an electronic equipment 250 which is applied with the second modification shown in FIG. 39. In

17

FIG. 40, the semiconductor element 11 which generates heat with a relatively high density and other semiconductor elements 253 which generate heat with a relatively low density coexist on the circuit substrate 12.

A passage forming member 255 is directly mounted on the semiconductor element 11 so as to cover the top surface 11a thereof, and a passage 256 is formed between the passage forming member 255 and the top surface 11a. The partition members 240-1, 240-2 and 240-3 similar to those shown in FIG. 39 are provided on the surface of the passage forming member 255 on the side of the passage 256. The coolant is supplied to the passage 256 via a joint 259 and a pipe 257, and the two-dimensional jet flows 242-1, 242-2 and 242-3 are generated so as to cool the semiconductor element 11.

When using compressed air as the coolant, the air ejected from the passage 256 is released to the atmosphere via a muffler 258 if necessary.

On the other hand, the other semiconductor elements 253 are cooled by a parallel air flow 254 generated within a passage 252 by a fan 251.

Hence, according to this second modification, it is possible to cool a small number of semiconductor elements 11 which generate heat with a relatively large density together with other semiconductor elements 253 which generate heat with a relatively small density and coexist on the circuit substrate 12 within the electronic equipment. For this reason, it is possible to improve the mounting density of the semiconductor elements. In addition, since the positional relationship of the semiconductor elements and the passage forming member 255 and the partition members 240-1, 240-2 and 240-3 can be fixed without being supported by the circuit substrate 12, the assembling process becomes simple and the cooling performance stabilizes.

Figure 41:
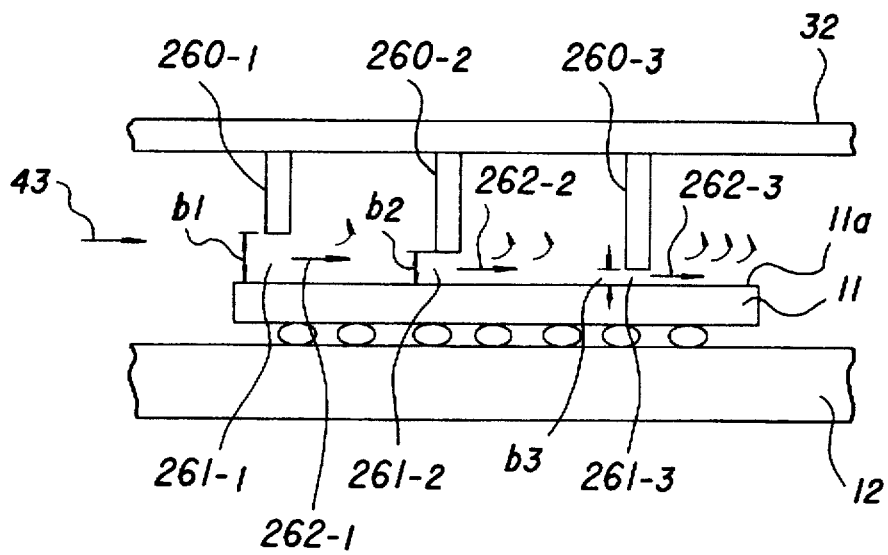
FIG. 41 is a side view showing a third modification of the fifth embodiment.

FIG. 41 shows a third modification of the fifth embodiment.

In FIG. 41, a plurality of partition members 260-1, 260-2 and 260-3 are arranged at arbitrary intervals along the direction of the parallel coolant flow 43 with respect to one semiconductor element 11. In addition, the lengths of the partition members 260-1, 260-2 and 260-3 in a direction perpendicular to the parallel coolant flow 43 are longer for the partition members located closer to the downstream side of the parallel coolant flow 43. In other words, slit-shaped coolant outlets 261-1, 261-2 and 261-3 are formed between the top surface 11a of the semiconductor element 11 and the corresponding partition members 260-1, 260-2 and 260-3, and gaps $b_1$, $b_2$ and $b_3$ of the slit-shaped coolant outlets 261-1, 261-2 and 261-3 satisfy a relation $b_1 > b_2 > b_3$.

The flow quantity of the parallel coolant flow 43 is constant at various parts along the semiconductor element 11. Hence, by employing the above described construction, it is possible to generate a two-dimensional jet flow which is faster at the slit-shaped coolant outlet located closer to the downstream side of the parallel coolant flow 43. For this reason, the cooling capacity improves towards the downstream side of the parallel coolant flow 43, and it is possible to compensate for the deterioration of the cooling capacity caused by the temperature rise of the parallel coolant flow 43 above the semiconductor element 11. Accordingly, it is possible to cool the entire semiconductor element 11 to an approximately uniform temperature.

Figure 42:
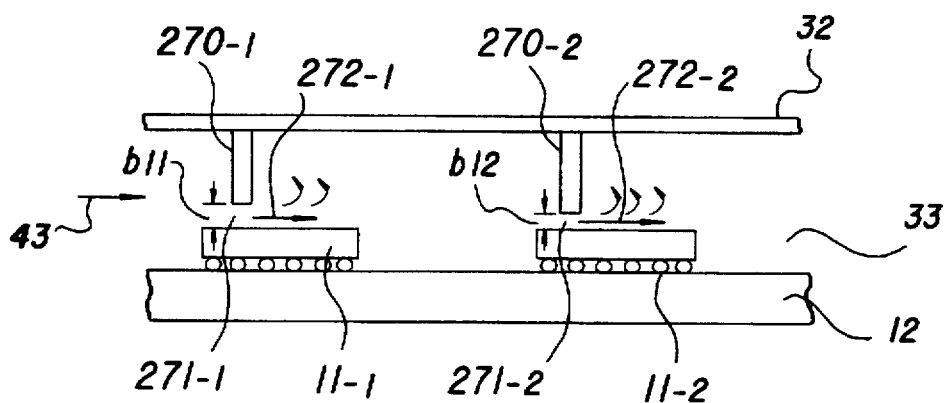
FIG. 42 is a side view showing a fourth modification of the fifth embodiment.

FIG. 42 shows a fourth modification of the fifth embodiment. In this fourth modification, the concept of the third modification shown in FIG. 41 is applied to a plurality of semiconductor elements 11-1 and 11-2 which are arranged along the parallel coolant flow 43.

18

In FIG. 42, partition members 270-1 and 270-2 are provided to confront the corresponding semiconductor elements 11-1 and 11-2. Slit-shaped coolant outlets 271-1 and 271-2 are respectively formed between the semiconductor elements 11-1 and 11-2 and the partition members 270-1 and 270-2. Gaps $b_{11}$ and $b_{12}$ of the slit-shaped coolant outlets 271-1 and 271-2 satisfy a relation $b_{11} > b_{12}$. In other words, the gap becomes narrower towards the downstream side of the parallel coolant flow 43.

By employing the above described construction, the two-dimensional jet flow generated is faster at the slit-shaped coolant outlet located closer to the downstream side of the parallel coolant flow 43, similarly as in the case of the third modification of the fifth embodiment. For this reason, the cooling capacity improves towards the downstream side of the parallel coolant flow 43, and it is possible to compensate for the deterioration of the cooling capacity caused by the temperature rise of the parallel coolant flow 43 above the semiconductor elements 11-1 and 11-2. Accordingly, it is possible to cool the semiconductor elements 11-1 and 11-2 in their entirety to an approximately uniform temperature.

Figure 43:
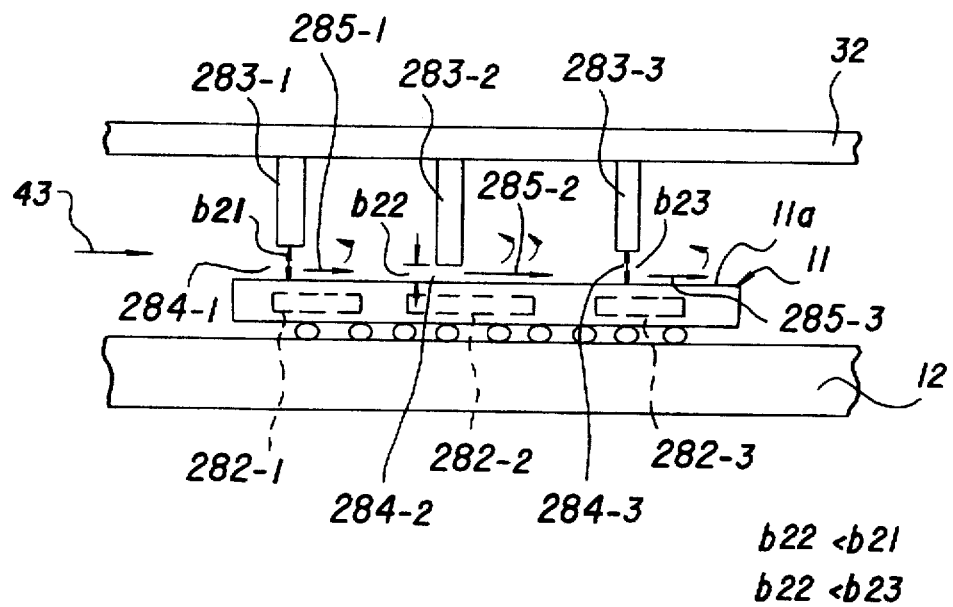
FIG. 43 is a side view showing a fifth modification of the fifth embodiment.

FIG. 43 shows a fifth modification of the fifth embodiment. In this fifth modification, the semiconductor element 11 includes a plurality of built-in semiconductor chips 282-1, 282-2 and 282-3, and the heat generated from the semiconductor element 11 is different depending on the parts of the semiconductor element 11. For the sake of convenience, it is assumed that the heat generated is the highest at the central part of the semiconductor element 11.

In FIG. 43, a plurality of partition members 283-1, 283-2 and 283-3 are arranged at arbitrary intervals along the direction of the parallel coolant flow 43. Slit-shaped coolant outlets 284-1, 284-2 and 284-3 are formed between the top surface 11a of the semiconductor element 11 and the corresponding partition members 283-1, 283-2 and 283-3. Gaps $b_{21}$, $b_{22}$ and $b_{23}$ of the slit-shaped coolant outlets 284-1, 284-2 and 284-3 satisfy relations $b_{21} > b_{22}$ and $b_{23} > b_{22}$, so that the gap becomes narrower towards the part of the semiconductor element 11 generating higher heat.

The flow quantity of the parallel coolant flow 43 is constant at various parts along the semiconductor element 11. For this reason, by employing the above described construction, the two-dimensional jet flow generated is faster at the slit-shaped coolant outlet provided at the part of the semiconductor element 11 generating high heat. As a result, the cooling capacity is improved for the part of the semiconductor element 11 generating the high heat, and it is possible to cool the entire semiconductor element 11 to an approximately uniform temperature.

Figure 44:
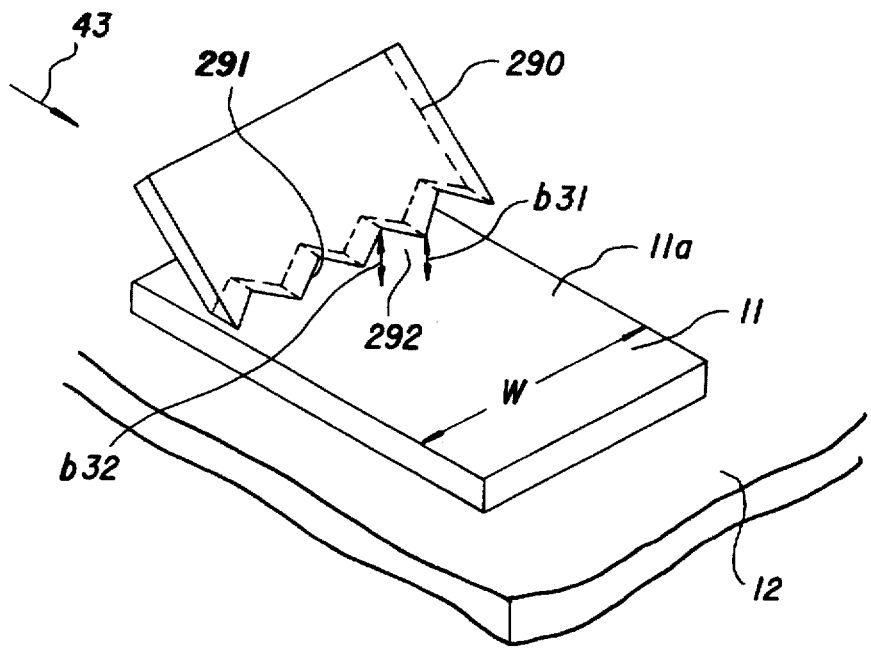
FIG. 44 is a perspective view showing a sixth modification of the fifth embodiment.

FIG. 44 shows a sixth modification of the fifth embodiment. In this sixth modification, a partition member 290 confronts the top surface 11a of the semiconductor element 11, and a plurality of undulations (or zigzag patterns) 291 are formed on the end of the partition member 290 when viewed from the downstream side of the parallel coolant flow 43.

In FIG. 44, the gap of a slit-shaped coolant outlet 292 differs between the mountain portion and the valley portion of the undulations 291. The resistance to the coolant is smaller at the larger gap when ejecting the coolant from the slit-shaped coolant outlet 292, and the coolant more easily flows through the larger gap. Hence, the coolant flow ejected from the slit-shaped coolant outlet 292 has a distribution such that the flow quantity alternately increases and decreases along the longitudinal direction of the slit-shaped coolant outlet 292. Consequently, the convection of the coolant along a width W of the semiconductor element 11 is stimulated, and the cooling efficiency with respect to the semiconductor element 11 is improved.

Figure 45:
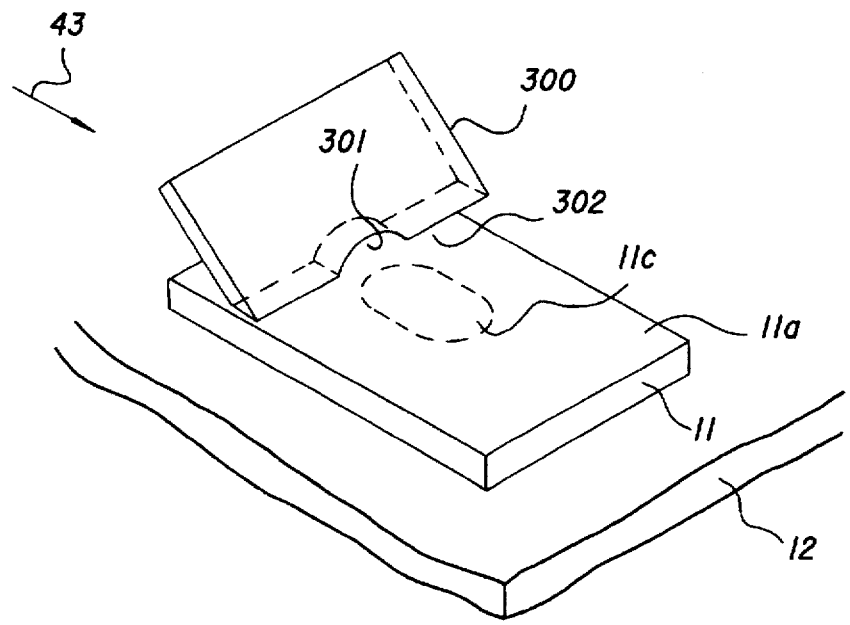
FIG. 45 is a perspective view showing a seventh modification of the fifth embodiment.

FIG. 45 shows a seventh modification of the fifth embodiment. In this seventh modification, a partition member 300 confronts the top surface 11a of the semiconductor element 11. A semi-circular groove 301 is formed at the end of the partition member 300 when viewed from the downstream side of the parallel coolant flow 43.

In FIG. 45, the gap of a slit-shaped coolant outlet 302 becomes larger at the groove 301. Hence, the flow quantity of the coolant ejected from the slit-shaped coolant outlet 302 is increased at the groove 301. As a result, it is possible to more efficiently cool a part 11c of the semiconductor element 11 corresponding to the groove 301.

Figure 46:
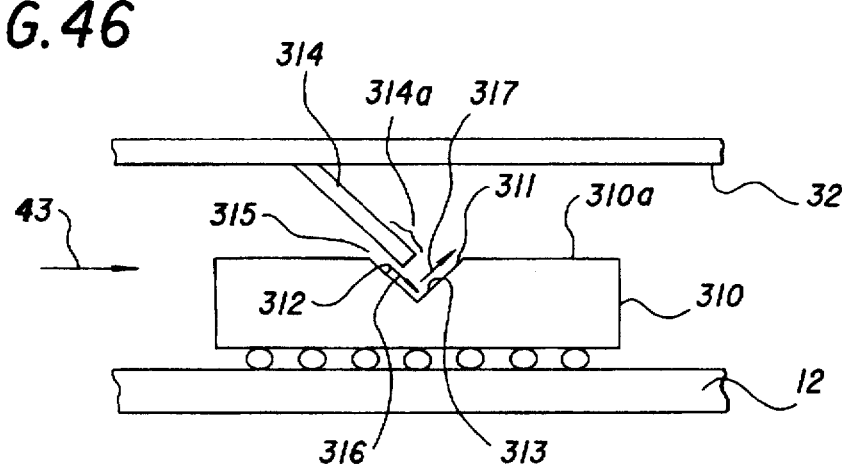
FIG. 46 is a side view showing an eighth modification of the fifth embodiment.

FIG. 46 shows an eighth modification of the fifth embodiment.

In FIG. 46, a V-shaped groove 311 traverses approximately a center of the top surface 11a of the semiconductor element 11. A partition member 314 is inclined to the downstream side of the parallel coolant flow 43, and a tip part 314a of the partition member 314 enters within the V-shaped groove 311 and confronts a surface 312 on the upstream side of the V-shaped groove 311. A slit-shaped coolant outlet 315 is formed between the tip part 314a and the surface 312.

A two-dimensional jet flow 316 ejected from the slit-shaped coolant outlet 315 first flows along the surface 312 on the upstream side of the V-shaped groove 311, then hits a surface 313 on the downstream side of the V-shaped groove 311 and rapidly changes direction, and thereafter flows along the surface 313 towards the downstream side as indicated by an arrow 317 in FIG. 46. The rapid change in the flow direction caused by such a collision at the surface 313 acts to further and more violently mix the coolant flow. As a result, it is possible to obtain a higher cooling efficiency with respect to the semiconductor element 11.

Figure 47:
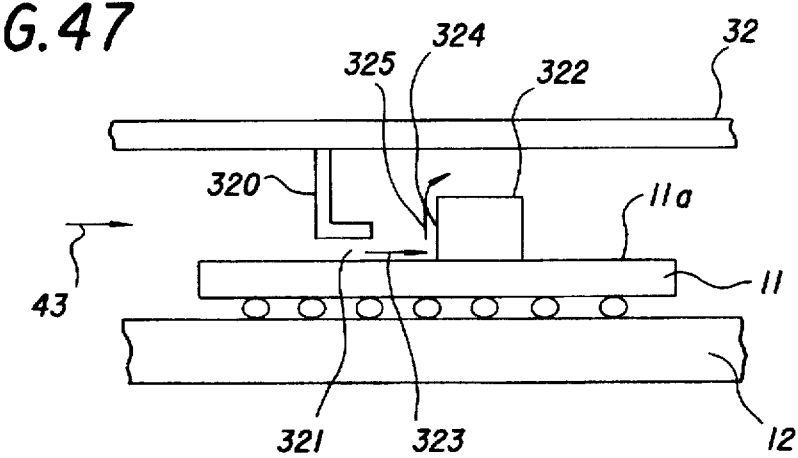
FIG. 47 is a side view showing a ninth modification of the fifth embodiment.

FIG. 47 shows a ninth modification of the fifth embodiment.

In FIG. 47, a partition member 320 which is provided on the passage forming member 32 has an L-shaped cross section when viewed from the side. A slit-shaped coolant outlet 321 is formed between the partition member 320 and the top surface 11a of the semiconductor element 11. On the other hand, a fin 322 having a rectangular cross section is provided on the top surface 11a of the semiconductor element 11 on the downstream side of the slit-shaped coolant outlet 321. This fin 322 is provided in parallel to the slit-shaped coolant outlet 321 with a predetermined interval formed therebetween.

A two-dimensional jet flow 323 ejected from the slit-shaped coolant outlet 321 hits a vertical surface 324 on the upstream side of the fin 322 and changes direction as indicated by an arrow 325. For this reason, it is possible to improve the cooling efficiency with respect to the semiconductor element 11, similarly to the eighth modification of the fifth embodiment. Furthermore, this ninth modification can be applied to a case where it is difficult to form a groove on the semiconductor element itself, such as the case of a bear chip.

Figure 48A:
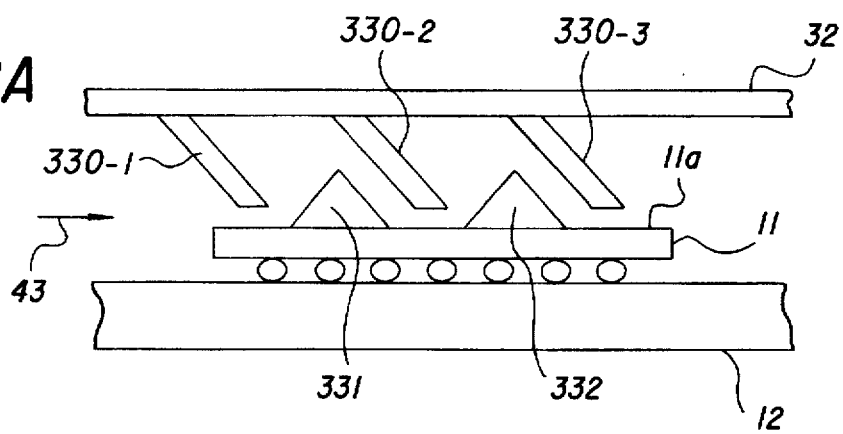
FIGS. 48A and 48B respectively are a side view and a plan view showing a tenth modification of the fifth embodiment.
Figure 48B:
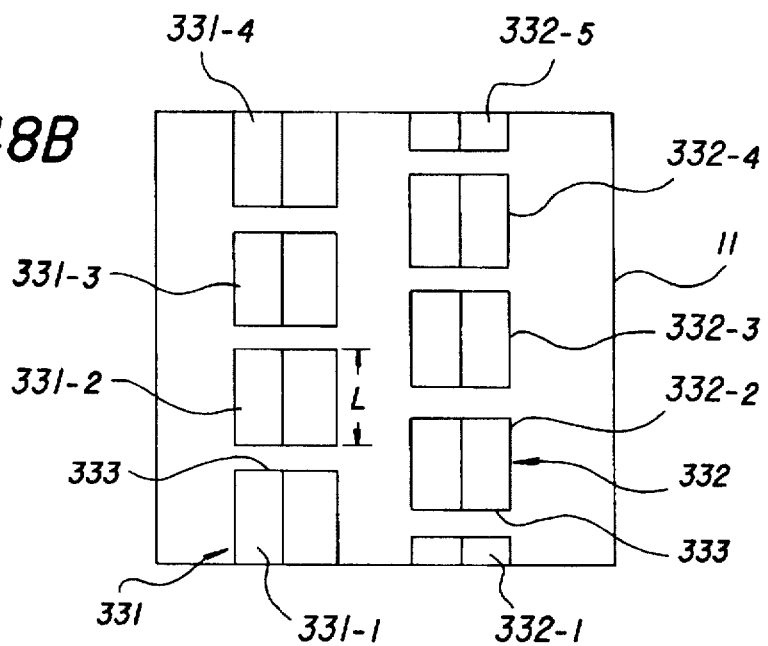

FIGS. 48A and 48B show a tenth modification of the fifth embodiment. FIG. 48A shows a side view of the tenth modification, and FIG. 48B shows a plan view of the semiconductor element of the tenth modification. According to this tenth modification, the fin of the ninth modification of the fifth embodiment shown in FIG. 47 is divided into a plurality of fin pieces along the longitudinal direction thereof.

A plurality of partition members 330-1, 330-2 and 330-3 are arranged at arbitrary intervals on the passage forming member 32 as shown in FIG. 48A, and fins 331 and 332 are provided in correspondence with the two partition members 330-1 and 330-2 on the upstream side of the parallel coolant flow 43. The fin 331 is made up of a plurality of fin pieces 331-1 through 331-4, and the fin 332 is made up of a plurality of fin pieces 332-1 through 332-4.

By employing this construction, it is possible to shorten a length L of each fin piece, and accordingly suppress the thermal stress which is generated due to a difference in the thermal expansions of the semiconductor element 11 and the fins 331 and 332. In addition, a side surface 333 is formed on each fin piece and the surface area of the fins 331 and 332 as a whole is increased, thereby improving the cooling efficiency.

Figure 49:
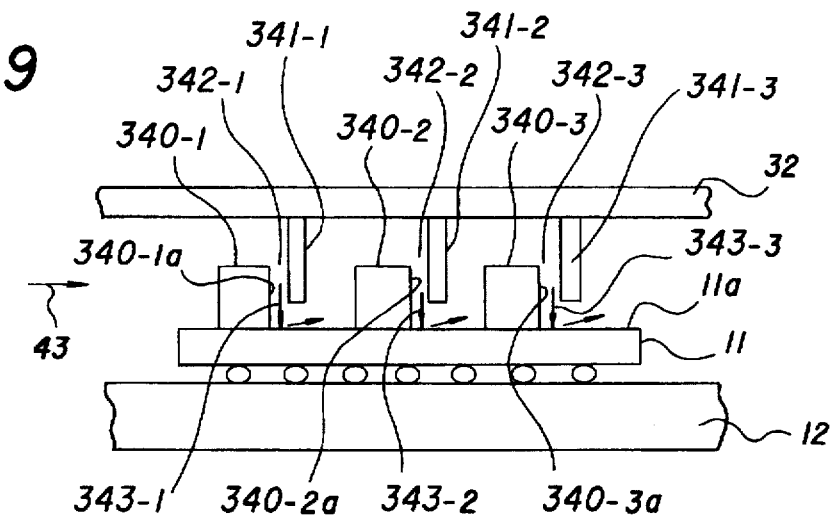
FIG. 49 is a side view showing an eleventh modification of the fifth embodiment.

FIG. 49 shows an eleventh modification of the fifth embodiment.

In FIG. 49, a plurality of fins 340-1, 340-2 and 340-3 having a rectangular cross section are provided on the top surface 11a of the semiconductor element 11. In addition, a plurality of partition members 341-1, 341-2 and 341-3 are arranged at arbitrary intervals on the passage forming member 32. The partition members 341-1, 341-2 and 341-3 respectively confront vertical surfaces 340-1a, 340-2a and 340-3a on the downstream sides of the fins 340-1, 340-2 and 340-3 with a predetermined gap formed therebetween, so as to form slit-shaped coolant outlets 342-1, 342-2 and 342-3.

By employing this construction, two-dimensional jet flows 343-1, 343-2 and 343-3 ejected from the slit-shaped coolant outlets 342-1, 342-2 and 342-3 hit the top surface 11a of the semiconductor element 11 and the heat transfer distance is shortened. As a result, it is possible to effectively utilize the high cooling efficiency at the parts where the coolant hits the top surface 11a.

Figure 50:
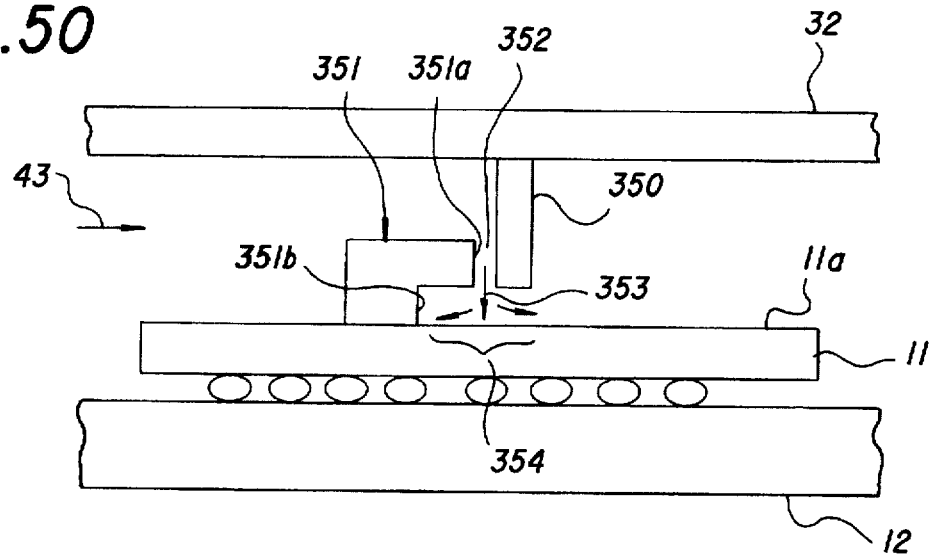
FIG. 50 is a side view showing a twelfth modification of the fifth embodiment.

FIG. 50 shows a twelfth modification of the fifth embodiment.

In FIG. 50, a partition member 350 confronts a vertical surface 351a on the downstream side of a fin 351 which is provided on the top surface 11a of the semiconductor element 11. A predetermined gap is formed between the partition member 350 and the vertical surface 351a, to form a slit-shaped coolant outlet 352. In addition, a cutout groove 351b is provided on the lower end of the vertical surface 351a and extends in the longitudinal direction of the fin 351. This cutout groove 351a spreads a region 354 where a jet flow 353 from the slit-shaped coolant outlet 352 hits the top surface 11a of the semiconductor element 11, in a direction towards the upstream side of the parallel coolant flow 43.

By employing this construction, the jet flow 353 becomes the two-dimensional jet flow and collides in the large region 354. In addition, the surface area of the fin 351 is large. As a result, the cooling efficiency with respect to the semiconductor element 11 is improved.

Figure 51A:
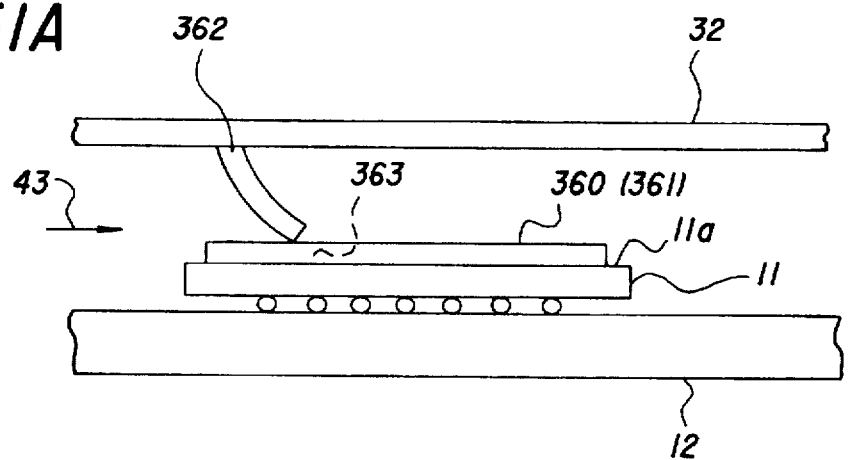
FIGS. 51A and 51B respectively are a side view and a perspective view showing a thirteenth modification of the fifth embodiment.
Figure 51B:
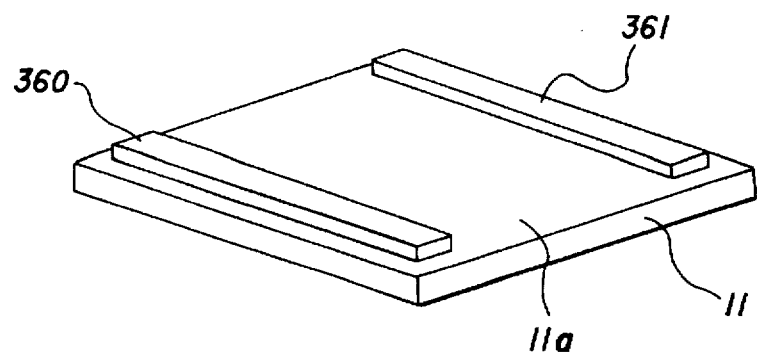

FIGS. 51A and 51B show a thirteenth modification of the fifth embodiment. FIG. 51A shows a plan view of the thirteenth modification, and FIG. 51B shows a perspective view of the thirteenth modification.

A plurality of spacer members 350 and 361 are provided on the top surface 11a of the semiconductor element 11 along the direction of the parallel coolant flow 43, as shown in FIG. 51B. In addition, as shown in FIG. 51A, a resilient partition member 362 is provided on the passage forming member 32. This resilient partition member 362 is made of a resilient plate. The resilient partition member 362 confronts the semiconductor element 11 in a state where tip ends of the resilient partition member 362 pushes against the spacer members 360 and 361.

A slit-shaped coolant outlet 363 having a gap of a high accuracy corresponding to the thickness of the spacer members 360 and 361 is automatically formed between the resilient partition member 362 and the top surface 11a of the semiconductor element 11 by the resilient deformation of the resilient partition member 362. For this reason, it is possible to absorb an error in the positional relationship between the passage forming member 32 and the semiconductor element 11, and the assembling process is facilitated and the cooling performance stabilizes.

Various resilient materials may be used for the resilient partition member 362. Examples of such resilient materials are various kinds of resins, and alloys such as phosphor bronze and beryllium copper.

Figure 52A:
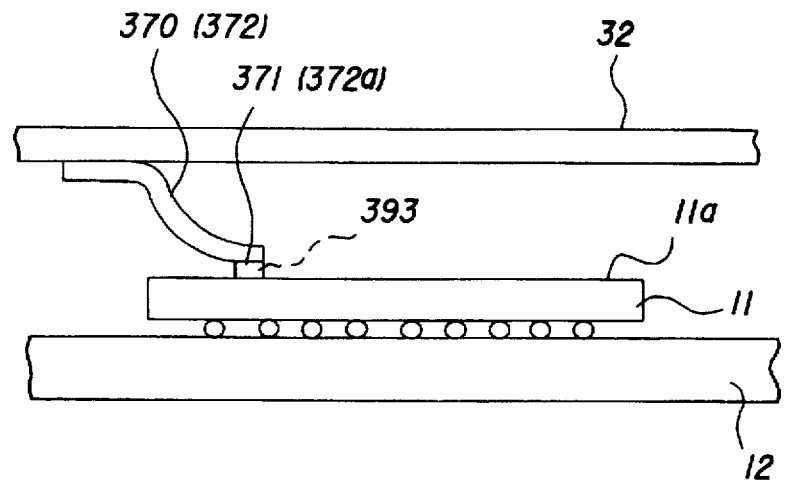
FIGS. 52A, 52B and 52C respectively are a side view, a perspective view and a perspective view showing a fourteenth modification of the fifth embodiment.
Figure 52B:
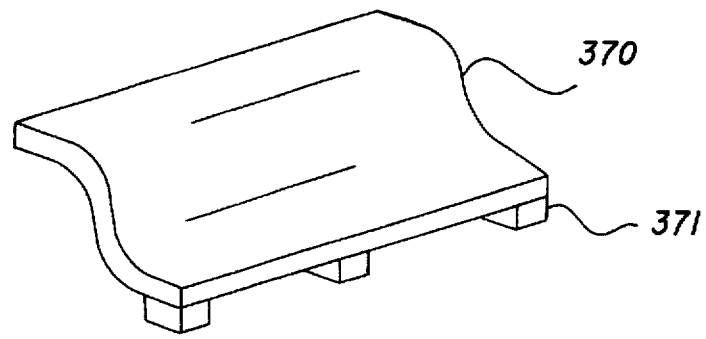
Figure 52C:
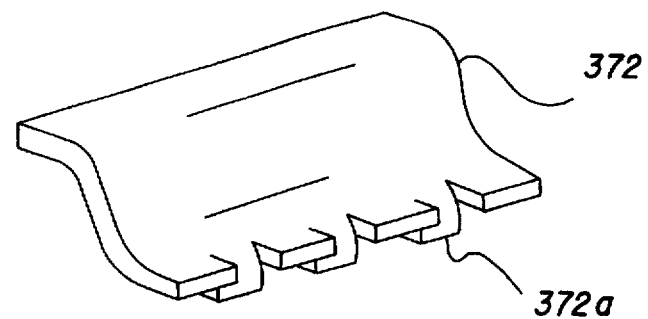

FIGS. 52A, 52B and 52C show a fourteenth modification of the fifth embodiment. FIG. 52A shows a side view of the fourteenth modification, and FIGS. 52B and 52C show perspective views of the fourteenth modification. According to this fourteenth modification, the resilient partition member has the function corresponding to the spacer members of the thirteenth modification of the fifth embodiment shown in FIGS. 51A and 51B.

As shown in FIGS. 52A and 52B, a resilient partition member 370 is provided with a plurality of spacer members 371 at a tip end confronting the top surface 11a of the semiconductor element 11. The resilient partition member 370 is made of a resilient plate.

Alternatively, as shown in FIGS. 52A and 52C, a resilient partition member 372 is provided with a plurality of cutout parts 372a at a tip end confronting the top surface 11a of the semiconductor element 11. The resilient partition member 372 is made of a resilient plate. In addition, the cutout parts 372a are bent towards the semiconductor element 11.

In other words, the spacer members 371 at the tip end of the resilient partition member 370 and the cutout parts 372a at the tip end of the resilient partition member 372 push against the top surface 11a of the semiconductor element 11 and confront the semiconductor element 11. Therefore, by employing the above described construction, it is possible to easily form a slit-shaped coolant outlet 393 having a gap with a high accuracy, similarly to the thirteenth modification of the fifth embodiment.

Further, the present invention is not limited to these embodiments, but various variations and modifications may be made without departing from the scope of the present invention.

What is claimed is:

1. A semiconductor element cooing apparatus for cooling at least one semiconductor element mounted on a circuit substrate, said semiconductor element having a top surface which radiates heat, said semiconductor element cooling apparatus comprising:

coolant flow generating means for generating a coolant flow by flowing a coolant over the top surface of the semiconductor element; and coolant flow obstructing means for obliquely obstructing and disrupting the coolant flowing over the top surface of the semiconductor element from an upstream side towards a downstream side of the coolant flow, said coolant flow obstructing means being connected to said semiconductor element to form a heat sink, said coolant flow obstructing means comprising:

a plurality of inclined pillar-shaped radiator fins provided on the top surface of the semiconductor element and respectively having a top portion which is inclined towards the upstream side of the coolant flow, said top portion extending from the top surface of the semiconductor element in a direction non-perpendicular to the coolant flow.

2. The semiconductor element cooling apparatus as claimed in claim 1, wherein said coolant flow obstructing means further comprises:

a comb shaped structure connecting top ends of the inclined pillar-shaped radiator fins.

3. A semiconductor element cooling apparatus for cooling at least one semiconductor element mounted on a circuit substrate, said semiconductor element having a top surface which radiates heat, said semiconductor element cooling apparatus comprising:

a passage forming member forming a passage between said passage forming member and the top surface of the semiconductor element;

a coolant driving unit supplying a coolant to the passage so as to form a parallel coolant flow above the top surface of the semiconductor element, said parallel coolant flow being approximately parallel to the top surface of the semiconductor element; and one or more partition members provided on an inner top surface of said passage forming member confronting the top surface of the semiconductor element, such that said parallel coolant flow is restricted between said one or more partition members and the top surface of the semiconductor element, each of said partition members having a base part connected to said inner top surface of said passage, said base part extending in a direction generally perpendicular to the parallel coolant flow, and a tip part extending towards the top surface of said semiconductor element and forming a slit-shaped coolant outlet having a predetermined gap between the tip part and the top surface of the semiconductor element, at least one partition member confronting a portion of the top surface of a corresponding semiconductor element, which portion is located on an upstream side of the parallel coolant flow relative to other portions on the top surface of said corresponding semiconductor element.

4. The semiconductor element cooling apparatus as claimed in claim 3, wherein one or more of said partition members are arranged in a direction of the parallel coolant flow.

5. The semiconductor element cooling apparatus as claimed in claim 3, which further comprises:

one or more surfaces provided on the top surface of the semiconductor element, the coolant ejected from said slit-shaped coolant outlet hitting one or more of said surfaces.

6. The semiconductor element cooling apparatus as claimed in claim 5, wherein one or more of said surfaces is perpendicular to or is inclined with respect to a direction in which the coolant is ejected from said slit-shaped coolant outlet.

7. The semiconductor element cooling apparatus as claimed in claim 6, wherein said slit-shaped coolant outlet and a corresponding one of said surfaces are arranged parallel to each other with a predetermined interval therebetween along a direction of the parallel coolant flow.

8. The semiconductor element cooling apparatus as claimed in claim 3, wherein one or more of said partition members are structurally connected to the semiconductor element directly without being supported by the circuit substrate.

* * * * *